US012751076B2

(12) United States Patent
Zou et al.

(10) Patent No.: US 12,751,076 B2
(45) Date of Patent: Sep. 29, 2026

(54) INTEGRATION OF A VERTICAL DIODE AND A TRANSISTOR

(71) Applicant: INTERNATIONAL BUSINESS MACHINES CORPORATION, Armonk, NY (US)

(72) Inventors: Lijuan Zou, Albany, NY (US); Tao Li, Slingerlands, NY (US); Ruilong Xie, Niskayuna, NY (US); Robert Gauthier, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 355 days.

(21) Appl. No.: 18/529,077

(22) Filed: Dec. 5, 2023

(65) Prior Publication Data

US 2025/0185352 A1 Jun. 5, 2025

(51) Int. Cl.

| | |
|---|---|
| ***H10D 84/80*** | (2025.01) |
| ***H10D 8/50*** | (2025.01) |
| ***H10D 30/67*** | (2025.01) |
| ***H10D 62/13*** | (2025.01) |

(52) U.S. Cl.

CPC ............ *H10D 84/811* (2025.01); *H10D 8/50* (2025.01); *H10D 30/6757* (2025.01); *H10D 62/151* (2025.01)

(58) Field of Classification Search

CPC .... H10D 84/811; H10D 30/6757; H10D 8/50; H10D 62/151

See application file for complete search history.

(56) References Cited

U.S. PATENT DOCUMENTS

| | | | | |
|---|---|---|---|---|
| 10,256,230 | B2 | 4/2019 | Balakrishnan | |
| 11,362,086 | B2 | 6/2022 | Balakrishnan | |
| 11,616,056 | B2 * | 3/2023 | Lilak .................. | H10D 84/811 257/76 |
| 2019/0371891 | A1 | 12/2019 | Goktepeli | |
| 2022/0199615 | A1 | 6/2022 | Jayanthinarasimham | |
| 2023/0069501 | A1 | 3/2023 | Yeh | |
| 2023/0089395 | A1 | 3/2023 | Orr | |
| 2023/0092061 | A1 | 3/2023 | Hong | |
| 2023/0197862 | A1 | 6/2023 | Prashant | |
| 2023/0275084 | A1 | 8/2023 | Hong | |

FOREIGN PATENT DOCUMENTS

| | | |
|---|---|---|
| EP | 4184578 A1 | 5/2023 |

* cited by examiner

*Primary Examiner* — Richard A Booth

(74) *Attorney, Agent, or Firm* — Seed Intellectual Property Law Group LLP

(57) ABSTRACT

A semiconductor integrated circuit (IC) device includes both a transistor and a vertical diode. In some examples, the transistor includes a backside source/drain (S/D) contact and the vertical diode includes a backside bottom contact. The backside S/D contact and the backside bottom contact may be electrically connected to a backside BEOL network. The transistor may further include a S/D region that includes an upper S/D portion and a trench S/D portion that has a higher dopant concentration relative to the upper portion. The backside S/D contact may be connected to the trench S/D portion of the S/D region. The vertical diode may include a bottom doped region which may be simultaneously formed along with the trench S/D portion and may be composed of substantially the same materials. The backside bottom contact may be directly connected to the bottom doped region of the vertical diode.

19 Claims, 14 Drawing Sheets

INTEGRATION OF A VERTICAL DIODE AND A TRANSISTOR

BACKGROUND

Modern semiconductor integrated circuit (IC) devices include various types of microdevices, such as transistors and diodes. Currently, it is difficult to integrate or fabricate these various microdevices utilizing the same or similar advanced technology fabrication stages, such as finFET fabrication stages, nanosheet transistor fabrication stages, or the like.

SUMMARY

In an embodiment of the disclosure, a semiconductor integrated circuit (IC) device is presented. The semiconductor IC device includes a transistor and a vertical diode. The transistor includes a first p-doped source/drain (S/D) region, a second p-doped S/D region, one or more channels between the p-doped S/D region and the second p-doped S/D region, a gate around the one or more channels, and a p-doped trench S/D region below the p-doped S/D region. The vertical diode includes an intrinsic semiconductor region between a top n-doped diode region and a bottom p-doped diode region.

In another embodiment of the disclosure, a semiconductor integrated circuit (IC) device is presented. The semiconductor IC device includes a transistor region with a transistor therein and a diode region. The transistor includes a first p-doped source/drain (S/D) region, a second p-doped S/D region, one or more channels between the first p-doped S/D region and the second p-doped S/D region, a gate around the one or more channels, and a p-doped trench S/D region below the first p-doped S/D region. The diode region includes a first vertical diode that includes a first top n-doped diode region, a second vertical diode that includes a second top n-doped diode region, a shared intrinsic semiconductor region connected to the first top n-doped diode region and to the second top n-doped diode region, and a shared bottom p-doped diode region connected to the shared intrinsic semiconductor region.

In another embodiment of the disclosure, a semiconductor integrated circuit (IC) device fabrication method is presented. The method includes simultaneously forming a p-doped trench source/drain (S/D) region of a transistor and forming bottom p-doped diode region of a vertical diode.

The above summary is not intended to describe each illustrated embodiment or every implementation or example of the present disclosure.

BRIEF DESCRIPTION OF THE DRAWINGS

The drawings included in the disclosure are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
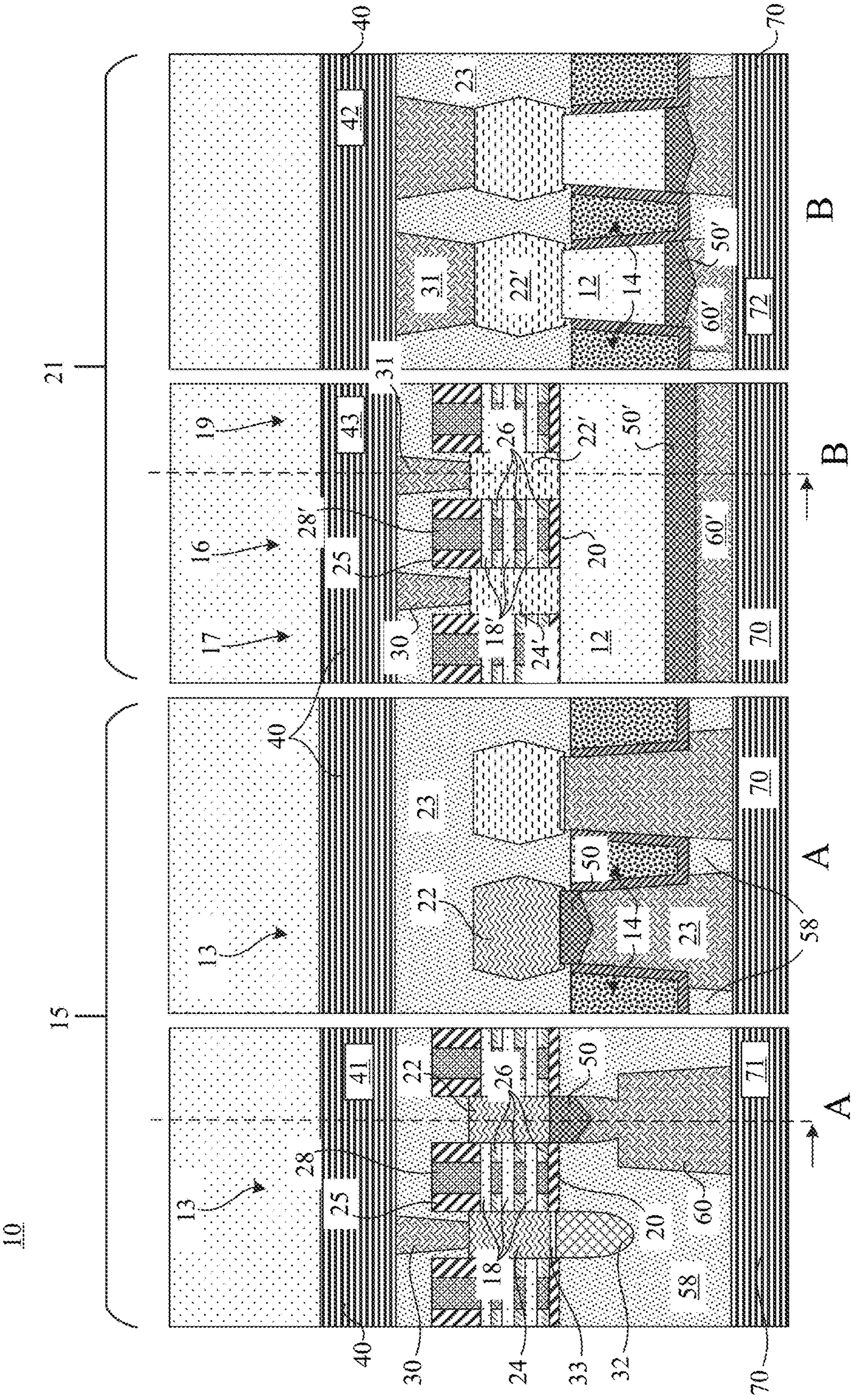
FIG. 1 depicts a cross-section view of a semiconductor IC device that includes a transistor and a vertical diode, according to one or more embodiments of the disclosure.

The embodiments of the present disclosure relate to fabrication methods and resulting structures for semiconductor devices. More specifically, the present disclosure relates to fabrication methods and resulting semiconductor integrated circuit (IC) devices that include a transistor and a vertical diode. In some examples, the transistor includes a backside source/drain (S/D) contact and the vertical diode includes a backside bottom contact. The backside S/D contact and the backside bottom contact may be electrically connected to a backside BEOL network. The transistor may further include a S/D region that may include an upper S/D portion and a trench S/D portion that has a higher dopant concentration relative to the upper portion. The backside S/D contact may be directly connected to the trench S/D portion of the S/D region. The vertical diode may include a bottom doped region. The bottom doped region of the vertical diode and the trench S/D portion of the S/D region may be simultaneously formed and may be composed of substantially the same materials. The backside bottom contact may be directly connected to the bottom doped region of the vertical diode.

A diode may include an intrinsic semiconductor region between a p-type doped semiconductor region and an n-type doped semiconductor region. This diode operates when the intrinsic semiconductor region is flooded with charge carriers from the p-type doped semiconductor region and the n-type doped semiconductor region. The diode will conduct current once the flooded electrons and holes reach an equilibrium point, where the number of electrons is equal to the number of holes in the intrinsic semiconductor region.

When the diode is forward biased, the injected carrier concentration is typically several orders of magnitude higher than the intrinsic semiconductor region carrier concentration. Due to this high-level injection, which in turn is due to the depletion process, the electric field extends deeply (almost the entire dimension between the p-type doped semiconductor region and the n-type doped semiconductor region) into the intrinsic semiconductor region. This electric field helps in speeding up of the transport of charge carriers from the p-type doped semiconductor region to the n-type doped semiconductor region, which results in faster operation of the diode, making it a suitable device for high-frequency operation.

A transistor is a type of microdevice that may be fabricated in semiconductor IC device front-end-of-line (FEOL) fabrication operations. Conventional transistors, or the like, incorporate planar field effect transistors (FETs) in which current flows through a semiconducting channel between a source and a drain, in response to a voltage applied to the gate. The semiconductor industry strives to obey Moore's law, which holds that each successive generation of integrated circuit devices shrinks to half its size and operates twice as fast. As device dimensions have shrunk, however, conventional silicon device geometries and materials have had trouble maintaining switching speeds without incurring failures such as, for example, leaking current from the device into the semiconductor substrate. Several new technologies emerged that allowed chip designers to continue shrinking transistor sizes. A FET generally is a transistor in which output current, i.e., source-drain current, is controlled by a voltage applied to an associated gate. A FET typically has three terminals, i.e., a gate structure, a source region, and a drain region. A gate structure is a structure used to control output current (i.e., flow of carriers in the channel) of a semiconducting device through electrical or magnetic fields. A channel is the region of the FET underlying the gate structure and between the source and drain of the semiconductor IC device that becomes conductive when the semiconductor device is turned on. The source is a doped region in the semiconductor IC device, in which majority carriers are flowing into the channel. A drain is a doped region in the semiconductor IC device located at the end of the channel, in which carriers are flowing out of the transistor through the drain.

One technology change modified the structure of the FET from a planar device to a three-dimensional device in which the semiconducting channel was replaced by a fin that extends out from the plane of the substrate. In such a device, commonly referred to as a FinFET, the control gate wraps around three sides of the fin to influence current flow from three surfaces instead of one. The improved control achieved with a 3D design results in faster switching performance and reduced current leakage. Building taller devices has also permitted increasing the device density within the same footprint that had previously been occupied by a planar FET.

The FinFET concept was further extended by developing a gate all-around FET, or GAA FET, in which the gate fully wraps around one or more channels for maximum control of the current flow therein. In the GAA FET, the channels can take the form of nanolayers, nanosheets, or the like, that are isolated from the substrate. In the GAA FET, channel surfaces are in respective contact with the source and drain and other respective channel surfaces are in contact with and surrounded by the gate.

The flowcharts and cross-sectional diagrams in the drawings illustrate a method of fabricating a semiconductor IC device, such as a processor, field programmable gate array (FPGA), memory module, or the like. In some alternative implementations, the fabrication steps may occur in a different order than that which is noted in the drawings, and certain additional fabrication steps may be implemented between the steps noted in the drawings. Moreover, any of the layered structures depicted in the drawings may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" if the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the depicted structure(s) as oriented. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, ±2%, or the like, difference between the coplanar materials.

As used herein, the term "coplanar" refers to two surfaces that lie in a common plane. In other words, two surfaces are coplanar if there exists a geometric plane that contains all the points of both of the surfaces. Accordingly, two surfaces may be referred to as substantially coplanar despite deviations from coplanarity, so long as those deviations do not impact the desired result of the coplanarity.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

For the sake of brevity, conventional techniques related to semiconductor IC device fabrication may or may not be described in detail and/or depicted herein. Moreover, the various tasks and process steps described herein can be incorporated into a more comprehensive procedure or process having additional steps or functionality not described and/or not depicted in detail herein. Various steps in the manufacture of semiconductor devices are well known and so, in the interest of brevity, many conventional steps will only be mentioned briefly herein, will be omitted entirely without providing the well-known process details, and/or will not be depicted.

In general, the various processes used to form a semiconductor IC device that may be packaged into an IC package fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, a metal-oxide-semiconductor field-effect transistor (MOSFET) may be used for amplifying or switching electronic signals. The MOSFET has a source electrode, a drain electrode, and a metal oxide gate electrode. The metal gate portion of the metal oxide gate electrode is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (nFET) and p-type field effect transistors (pFET) are two types of complementary MOSFETs. The nFET includes n-doped source and drain regions and uses electrons as the charge carrier. The pFET includes p-doped source and drain regions and uses holes as the charge carrier. Complementary metal oxide semiconductor (CMOS) is a technology that uses complementary and symmetrical pairs of p-type and n-type MOSFETs to implement logic functions. As mentioned above, hole mobility on the pFET may have an impact on overall device performance.

The wafer footprint of a FET is related to the electrical conductivity of the channel material. If the channel material has a relatively high conductivity, the FET can be made with a correspondingly smaller wafer footprint. A method of increasing channel conductivity and decreasing FET size is to form the channel as a nanostructure, such as a nano wire, nano ribbon, nanolayer, nanosheet, or the like, hereinafter referred to as a nanolayer. For example, a GAA FET provides a relatively small FET footprint by forming the channel region as a series of vertically stacked nanolayers. In a GAA configuration, a GAA FET includes a source region, a drain region and vertically stacked nanolayer channels between the source and drain regions. These devices typically include one or more suspended nanolayers that serve as the channel. A gate surrounds the stacked nanolayers and regulates electron flow through the nanolayers between the source and drain regions. GAA FETs may be fabricated by forming alternating layers of active nanolayers and sacrificial nanolayers. The sacrificial nanolayers are released from the active nanolayers before the FET device is finalized. For n-type FETs, the active nanolayers are typically silicon (Si) and the sacrificial nanolayers are typically silicon germanium (SiGe). For p-type FETs, the active nanolayers can be SiGe and the sacrificial nanolayers can be Si. In some implementations, the active nanolayers of a p-type FET can be SiGe or Si, and the sacrificial nanolayers can be Si or SiGe. Forming the nanolayers from alternating layers of active nanolayers formed from a first type of semiconductor material (e.g., Si for n-type FETs, and SiGe for p-type FETs) and sacrificial nanolayers formed from a second type of semiconductor material (e.g., SiGe for n-type FETs, and Si for p-type FETs) may provide for superior channel electrostatics control, which is necessary for continuously scaling gate lengths.

For some semiconductor IC devices, integration of transistors and diodes with a backside back-end-of-line (BEOL) network is one of the key challenges to providing increasing packaged IC device densities and performance increases. By incorporating a backside BEOL network into the semiconductor IC device, routing congestion may be eased. Currently, there is a need for semiconductor IC device fabrication techniques that integrate transistors and diodes with a backside BEOL network.

Referring now to FIG. 1, a cross-sectional view of an illustrative semiconductor integrated circuit (IC) device 10 that includes a transistor 13 and a first vertical diode 19 is depicted. In an embodiment, the transistor 13 may include a first p-doped source/drain (S/D) region 22, a second p-doped S/D region 24, one or more channels 18 between the first p-doped S/D region 22 and the second p-doped S/D region 24, a gate 28 around the one or more channels 18, and a p-doped trench S/D region 50 below the first p-doped S/D region 22. The vertical diode may include an intrinsic semiconductor region 12 between a top n-doped diode region 22' and a bottom p-doped diode region 50'.

In an example, the p-doped trench S/D region 50 and the bottom p-doped diode region 50' may be simultaneously formed and therefore may be composed of a same semiconductor material and a same dopant at a substantially same concentration.

In an example, a top surface of the bottom p-doped diode region 50' is below a bottom surface of the p-doped trench S/D region 50. Further, in an example, a bottom surface of the first p-doped S/D region 22, a bottom surface of the second p-doped S/D region 24, and a bottom surface of the n-doped diode region 22' are substantially coplanar. Similarly, in an example, a top surface of the first p-doped S/D region 22, a top surface of the second p-doped S/D region 24, and a top surface of the n-doped diode region 22' are substantially coplanar. In these examples, such coplanarities may be achieved by the formation of S/D regions in sequential p-doped S/D region and n-doped S/D region fabrication stages, or vice versa.

In an example, the semiconductor IC device 10 may further include an inactive region 16 that is adjacent to the first vertical diode 19. The inactive region 16 may include one or more inactive channels 18' connected to the n-doped diode region 22' and an inactive gate 28' around the one or more inactive channels 18'. In an example, the inactive region 16 is inactive because charge carriers (e.g., electrons) do not flow across the inactive channels 18'. In an example, the inactive region 16 is inactive because the inactive gate 28' is electrically isolated. For example, the inactive gate 28' is electrically isolated from a frontside BEOL network and from a backside BEOL network or any other structure that may apply an adequate voltage potential thereto to cause charge carriers to flow through the inactive channels 18'.

In an example, a dopant concentration within the first p-doped S/D region 22 is less than a dopant concentration within the p-doped trench S/D region 50. For example, the p-doped trench S/D region 50 is heavily doped (e.g., on the order of one dopant atom per ten thousand atoms) and the first p-doped S/D region 22 is relatively less doped.

In an example, a bottom surface of the p-doped trench S/D region 50 is below a bottom surface of the first p-doped S/D region 22. For instance, the first p-doped S/D region 22 need not be gouged prior to the formation of the p-doped trench S/D region 50 therefrom.

In an example, the semiconductor IC device 10 further includes a backside S/D contact 60 connected to the p-doped trench S/D region 50 and a backside diode contact 60' connected to the bottom p-doped diode region 50'. The semiconductor IC device 10 may further include a backside back end of line (BEOL) network 70 that has a first backside wire 71 connected to the backside S/D contact 60 and has a second backside wire 72 connected to the backside diode contact 60'.

In an example, the semiconductor IC device 10 further includes a frontside S/D contact 30 connected to the second S/D region 24 and a frontside diode contact 31 connected to the top n-doped diode region 22'. The semiconductor IC device 10 may further include a frontside BEOL network 40 that has a first frontside wire 41 electrically connected to the frontside S/D contact 30 and a second frontside wire 42 connected to the frontside diode contact 31.

In an embodiment, the semiconductor IC device 10 includes a transistor region 15 and a diode region 21. The transistor region 15 includes a transistor 13 and the diode region 21 includes the first vertical diode 19 and a second vertical diode 17. The transistor 13 may include the first p-doped S/D region 22, the second p-doped S/D region 24, the one or more channels 18 between the first p-doped S/D region 22 and the second p-doped S/D region 24, the gate 28 around the one or more channels 18, and the p-doped trench S/D region 50 below the first p-doped S/D region 22. The first vertical diode 19 includes the first top n-doped diode region 22' and the second vertical diode 17 includes a second top n-doped diode region 24'. The first vertical diode 19 and the second vertical diode 17 share the intrinsic semiconductor region 12 that is connected to the first top n-doped diode region 22' and to the second top n-doped diode region 24'. The first vertical diode 19 and the second vertical diode 17 further share the bottom p-doped diode region 50' that is connected to the intrinsic semiconductor region 12.

In an example, the p-doped trench S/D region 50 and the bottom p-doped diode region 50' are both composed of a same semiconductor material and a same dopant at a substantially same concentration.

In an example, a top surface of the bottom p-doped diode region 50' is below a bottom surface of the p-doped trench S/D region 50. Further in an example, a bottom surface of the first p-doped S/D region 22, a bottom surface of the second p-doped S/D region 24, a bottom surface of the first n-doped diode region 22', and a bottom surface of the second n-doped diode region 24' are substantially coplanar.

In an example, the diode region 21 further includes the inactive region 16 between to the first vertical diode 19 and the second vertical diode 17. The inactive region 16 includes the one or more inactive channels 18' between the first n-doped diode region 22' and the second n-doped diode region 24' and the inactive gate 28' around the one or more inactive channels 18'.

In an example, a dopant concentration within the first p-doped S/D region 22 and the second p-doped S/D region 24 is less than a dopant concentration within the first p-doped trench S/D region 50. For example, the p-doped trench S/D region 50 is heavily doped and the first p-doped S/D region 22 and the second p-doped S/D region 24 are relatively less doped.

In another embodiment, a semiconductor IC device 10 fabrication method is presented. The method includes at least simultaneously forming the p-doped trench S/D region 50 of the transistor 13 and forming the bottom p-doped diode region 50' of the vertical diode 19.

In examples, the second p-doped S/D region 24 is located above a backside contact placeholder 32. In some cases, an etch stop layer 33 may be between the second p-doped S/D region 24 and the backside contact placeholder 32.

In examples, a gate spacer 25 may be around the gate 28 and upon the topmost channel of the one or more channel 18. The gate spacer 25 may be between the frontside S/D contact 30 and may limit shorting between the gate 28 and the frontside S/D contact 30. A respective inner spacer 26 may be below and/or above one of the one or more channels 18 and may limit shorting between the first p-doped S/D region 22 and the gate 28 and the second p-doped S/D region 24 and the gate 28.

In examples, a bottom isolation region 20 may be between the bottommost inner spacers 26 and a backside interlayer dielectric (ILD) 58 and may be further between the gate 28 and the backside ILD 58. The backside ILD 58 may be further around the backside placeholder 32, the backside S/D contact 60, and/or the backside diode contact 60'.

In examples, a frontside ILD 23 may be upon the gate 28, upon the gate spacer 25, upon the first p-doped S/D region 22, upon the second p-doped S/D region 24, around the frontside S/D contact 30, upon shallow trench isolation (STI) regions 14, upon the inactive gate 28', upon the first n-doped diode region 22', upon the second n-doped diode region 24', around the frontside diode contact 30, and around frontside diode contact 31.

In examples, a respective inner spacer 26 may be below and/or above one of the one or more inactive channels 18'. In examples, a respective bottom isolation region 20 may be between the inactive gate 28 and the intrinsic semiconductor region 12.

Figure 2:
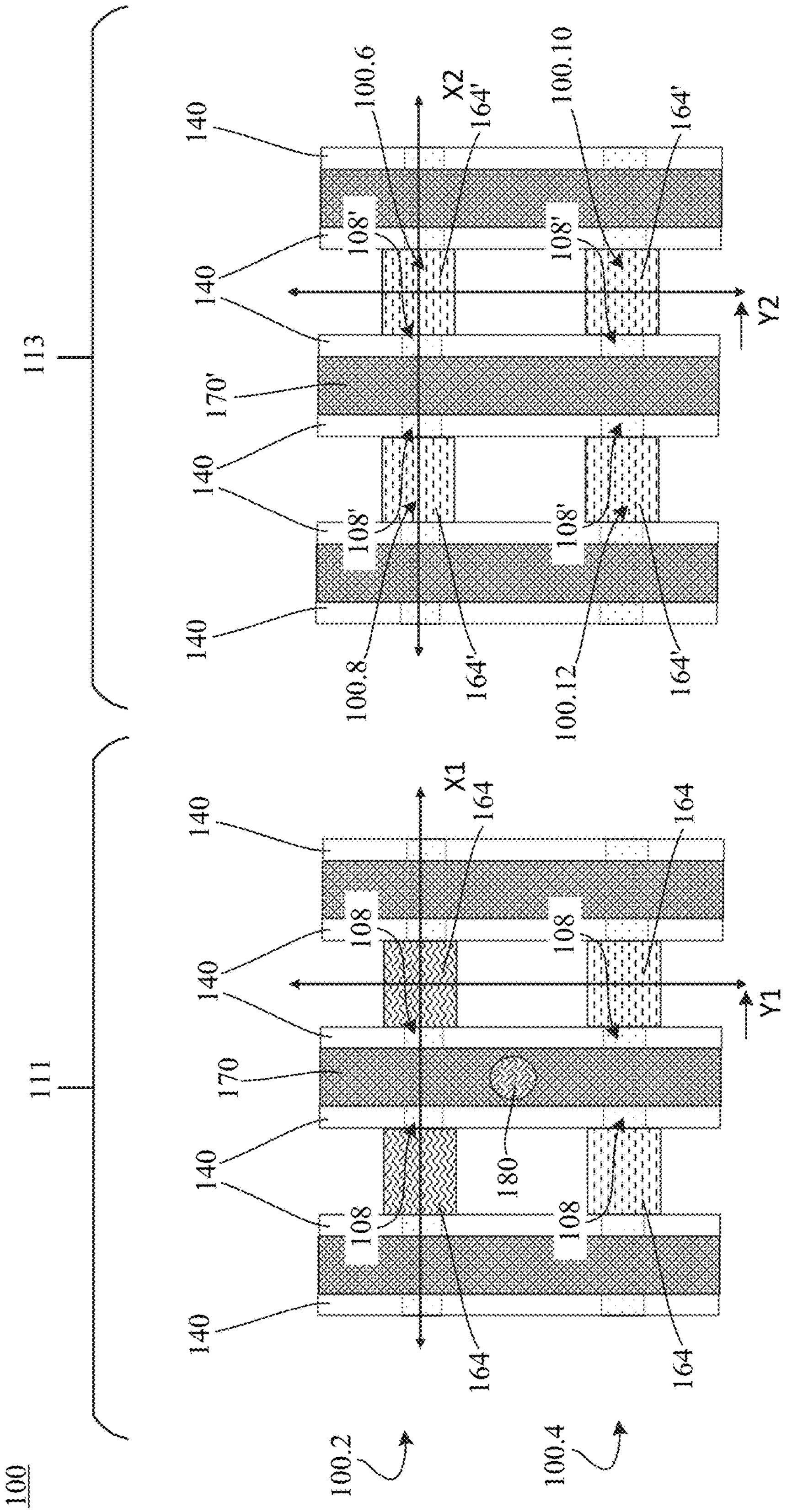
FIG. 2 depicts partial structure top-down view of a semiconductor IC device includes a transistor and a vertical diode, according to one or more embodiments of the disclosure.

FIG. 2 depicts a partial structural top-down view of a semiconductor IC device 100 that includes a transistor region 111 and a diode region 113. Transistor region 111 includes a transistor 100.2 and diode region 113 includes a vertical diode 100.6. Transistor region 111 may further include transistor 100.4. Diode region 113 may further include vertical diode 100.8, vertical diode 100.10, and vertical diode 100.12.

Each transistor 100.2, 100.4, may include a series of vertically stacked channels (e.g., a plurality of active semiconductor nanolayers 108 vertically stacked in various planes into and/or out of the page) between a respective source and/or drain (S/D) region (e.g., S/D regions 164). Transistors 100.2, 100.4, may share a replacement gate structure 170 that includes a conductive gate that is around and that contacts each of the series of vertically stacked channels of transistors 100.2, 100.4. A gate spacer 140 may contact and be against the replacement gate structure 170. In examples and as depicted, the S/D regions 164 within the transistor 100.2 may be of the same type and the S/D regions 164 within the transistors 100.4 may be of the same type and may further be the opposite type relative to those S/D regions 164 within the transistors 100.2. The replacement gate structure 170 may be electrically connected to a particular frontside wire within frontside BEOL network by way of at least a frontside contact 180.

Each vertical diode 100.2, 100.4 may include a series of vertically stacked inactive channels (e.g., a plurality of inactive semiconductor nanolayers 108' vertically stacked in various planes into and/or out of the page) between a respective top doped diode region 164'. An inactive region, such as an inactive replacement gate structure 170' includes a conductive gate that is around and that contacts each of the series of vertically stacked inactive channels. A gate spacer 140 may contact and be against the inactive replacement gate structure 170'. The inactive replacement gate structure 170' is electrically isolated from a frontside BEOL network and from a backside BEOL network or any other structure that may apply an adequate voltage potential thereto to cause charge carries to flow through the vertically stacked inactive channels. In examples and as depicted, top doped diode region 164' within the vertical diodes 100.6, 100.8, 100.10, and 100.12 may be of the same type and may further be the opposite type relative to those S/D regions 164 within the transistors 100.2.

A cross-sectional plane Y1, which is a vertical plane in the transistor region 111 and is located between adjacent replacement gate structures 170 across various S/D region 164 of the transistors 100.2, 100.4 and a cross-sectional plane X1, which is a vertical plane in the transistor region 111 and is located between S/D regions 164 of the transistor 100.2, 100.4 and spans across various replacement gate structures 170 are also depicted in FIG. 2. Similarly, a cross-sectional plane Y2, which is a vertical plane in the diode region 113 and is located between adjacent inactive replacement gate structures 170' across various top doped diode regions 164' of the transistors 100.6, 100.10 and a cross-sectional plane X2, which is a vertical plane in the diode region 113 and is located between top doped diode regions 164' of the vertical diodes 100.6, 100.8 and spans across various inactive replacement gate structures 170' are also depicted in FIG. 2. In an example, cross-sectional plane X1 and cross-sectional plane X2 are the same plane.

For clarity, one or more of the S/D regions 164 and the one or more top doped diode regions 164' may be simultaneously formed during the same epitaxial growth process, or the like. For example, the top doped diode regions 164' and the S/D regions 164 of transistor 100.4 may be simultaneously formed. As a result, the general and/or overall geometry of the top doped diode regions 164' and the S/D regions 164 may be substantially similar (e.g., perimeter shape, coplanar surfaces, or the like).

Figure 3:
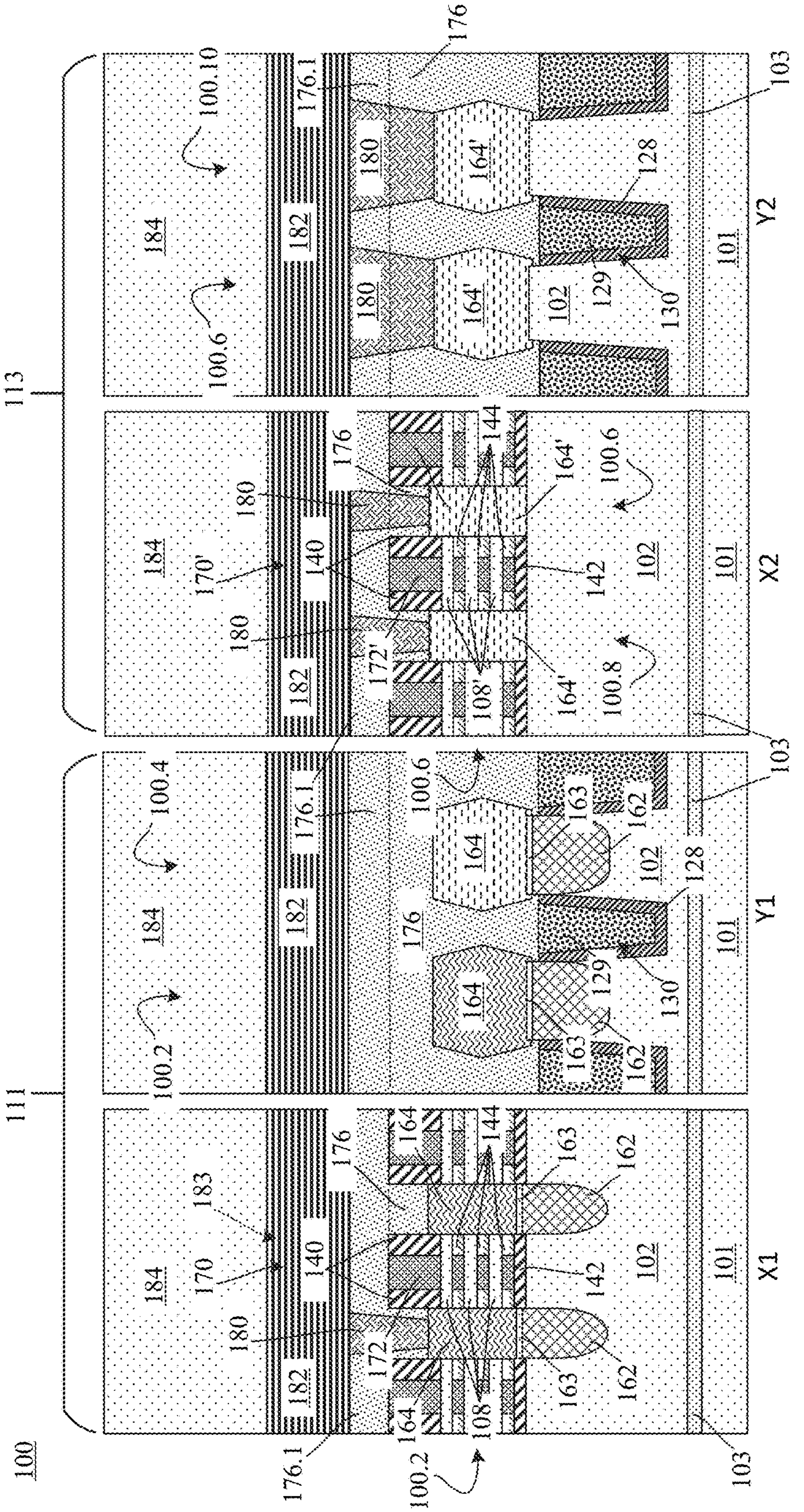
FIG. 3 through FIG. 13 depict various fabrication structure cross-section views of an illustrative semiconductor IC device that includes a transistor and a vertical diode, according to one or more embodiments of the disclosure.

FIG. 3 depicts a cross-sectional initial fabrication view of the semiconductor IC device 100 that is to include an integrated transistor, such as transistor 100.2, and vertical diode, such as vertical diode 100.6. At this initial fabrication stage, within the transistor region 111, the semiconductor IC device 100 may include a lower substrate 101, an etch stop layer 103, an upper substrate 102, STI regions 130, backside contact placeholders 162, separation layers 163, S/D regions 164, a frontside ILD 176, a frontside contact ILD 176.1, frontside contacts 180, a frontside BEOL network 182, and a carrier wafer 184.

Further, at this initial fabrication stage, within the diode region 113, the semiconductor IC device 100 may include the lower substrate 101, the etch stop layer 103, the upper substrate 102, STI regions 130, top doped diode regions 164', the frontside ILD 176, the frontside contact ILD 176.1, frontside contacts 180, the frontside BEOL network 182, and the carrier wafer 184.

For clarity, various background fabrication stages are described below that may be used to form the depicted semiconductor IC device 100. These background fabrication stages may reference structures that are not shown in the present cross-sections, but descriptions of the formation thereof are included herein to enable the illustrated semiconductor IC device 100 more fully.

The illustrative semiconductor IC device 100 may be formed by initially providing or forming a substrate structure. The substrate structure may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon (Si) is the predominantly used semiconductor material in wafer fabrication, alternative semiconductor materials can be employed, such as, but not limited to, gallium arsenide, gallium nitride, cadmium telluride, zinc selenide, and III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

In the depicted implementation, the substrate structure includes an upper substrate 102, a lower substrate 101, and an etch stop layer 103 between the upper substrate 102 and the lower substrate 101. The upper substrate 102 and the lower substrate 101 may be comprised of any suitable material(s) including those listed above, and the etch stop layer 103 may be a dielectric material with etch selectivity to one or both of the upper substrate 102 and/or the lower substrate 101. In one example, the etch stop layer 103 may be an oxide and the substrate structure may be referred to as a buried oxide (BOX) substrate. In another example, the lower substrate 101 may be composed of Si. The etch stop layer 103 may be composed of Silicon Germanium (SiGe) and may be epitaxially grown from the top surface of lower substrate 101 and the upper substrate 102 may be composed of Si and may be epitaxially grown from the top surface of etch stop layer 103.

Next, the illustrative semiconductor IC device 100 may be formed by forming nanolayers over the substrate structure by forming a bottommost sacrificial nanolayer (not shown) and by forming a series of alternating sacrificial nanolayers (not shown) and active nanolayers 108, thereupon. In certain examples, the bottommost sacrificial nanolayer is initially formed directly on an upper surface of the substrate structure. In other examples, certain layer(s) may be formed between the upper surface of the substrate structure and the bottommost sacrificial nanolayer. In an example, the bottommost sacrificial nanolayer may be formed by epitaxially growing a SiGe layer with a relatively high percentage of Ge, ranging from 50% to 70%. The bottommost sacrificial nanolayer may have etch selectivity relative to the sacrificial nanolayers and active nanolayers 108.

The nanolayers may be further formed by fabricating the alternating series of sacrificial nanolayers, such as SiGe sacrificial nanolayers, and active nanolayers 108, such as Si nanolayers, upon the bottommost sacrificial nanolayer. The sacrificial nanolayers can have Ge percentages ranging from 20% to 45%. In an implementation, the alternating active sacrificial nanolayer and active nanolayer 108 may be formed by epitaxially growing each layer until the desired number and desired thicknesses of the layers are achieved. Any number of alternating nanolayers can be provided. Epitaxial materials can be grown from gaseous or liquid precursors. For example, epitaxial materials can be grown using vapor-phase epitaxy (VPE), molecular-beam epitaxy (MBE), liquid-phase epitaxy (LPE), or other suitable processes.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a (100) orientated crystalline surface will take on a (100) orientation. In some embodiments, epitaxial growth and/or deposition processes are selective to forming on semiconductor surfaces, and generally do not deposit material on exposed surfaces, such as silicon dioxide or silicon nitride surfaces.

It should be appreciated that any suitable number of alternating nanolayers may be formed. Although it is specifically contemplated that the bottommost sacrificial nanolayer and the sacrificial nanolayers can be formed from SiGe and that the active nanolayers 108 can be formed from Si, it should be understood that any appropriate materials can be used instead, as long as the semiconductor materials have etch selectivity with respect to one or more of the others, as is consistent with the description of the fabrication stages herein.

Although it is specifically contemplated that the bottommost sacrificial nanolayer, the sacrificial nanolayers, and the active nanolayers 108 are formed by epitaxial growth, such nanolayers can be formed by any appropriate mechanism, such as chemical vapor deposition (CVD), physical vapor deposition (PVD), atomic layer deposition (ALD), or gas cluster ion beam (GCIB) deposition, or the like.

In certain embodiments, the nanolayers have a vertical thickness ranging, for example, from approximately 3 nm to approximately 20 nm. In certain embodiments, the nanolayers have a vertical thickness ranging, for example, from approximately 3 nm to approximately 10 nm. Although the range of 3-20 nm is cited as an example range of thickness of the nanolayers, other thickness of these nanolayers may be used. In certain examples, certain of the nanolayers may have different thicknesses relative to one another. In certain examples, it may be desirable to have a small vertical spacing (VSP) between adjacent active nanolayers 108 to reduce the parasitic capacitance and to improve circuit speed. For example, the VSP (the distance between vertically adjacent active nanolayers 108) may range from 5 nm to 15 nm. However, the VSP must be of a sufficient value to accommodate the formation of a gate that is to be formed in the spaces created by later removal of respective portions of the sacrificial nanolayers.

Further, in the depicted fabrication stages, the nanolayers may be patterned into nanolayer stacks and shallow trench isolation (STI) regions 130 may be formed within the substrate structure adjacent to the nanolayer stacks.

To form one or more nanolayer stacks, a mask layer (not shown) may be formed on the uppermost nanolayer. The mask layer may be comprised of any suitable mask material(s). The mask layer may be patterned and used to perform the nanolayer stack patterning process. In the nanolayer stack patterning process, any suitable material removal process (e.g., reactive ion etching or RIE) may be used to remove portions of the alternating nanolayers down to the level of the substrate structure, or the like. Following the nanolayer stack patterning process, the one or more nanolayer stacks are formed. Subsequently, the mask layer may be removed.

The removal of undesired portion(s) of the nanolayers may further remove undesired portions of substrate structure that are adjacent to respective footprints of nanolayer stacks to form STI region openings. The etch may be timed or otherwise controlled to stop the removal of the substrate structure such that the depth or bottom of the one or more STI region openings has a predetermined or desired dimension. For example, the depth or bottom of the one or more STI region openings may be above the etch stop layer 103. In some examples, the etch to form the nanolayer stacks may utilize the etch stop layer 103 to stop the etch and form the bottom well of the one or more STI region openings.

A STI region 130 may be formed upon and/or within the substrate structure within respective STI region openings. The STI regions 130 may be formed by depositing electrical dielectric material(s) within respective STI region opening(s) that are adjacent to the one or more nanolayer stacks. A top surface of the one or more STI regions 130 may be initially coplanar with or below a top surface of the substrate structure. In some implementations, further fabrication operations may generally remove portions of the STI regions 130 (e.g., sacrificial gate removal, replacement gate fabrication pre-clean, etc.), such that the top surfaces of the STI regions 130 are below the top surface of the substrate structure.

The one or more STI regions 130 may have a volume and/or geometry that sufficiently electrically isolates components or features of neighboring transistors 100.2, 100.4, 100.6, 100.8, and 100.10, or the like, and may sufficiently electrically isolate neighboring nanolayer stacks. For clarity, a particular STI region 130 may separate and adequately electrically isolate neighboring transistors 100.2, 100.4.

In an example, the STI region(s) 130 may be formed by depositing a STI liner 128 within the STI region openings. Subsequently, STI region(s) 130 may be further formed by depositing STI dielectric material 129 upon the STI liner 128. A etch back, recess, or the like, may occur to remove undesired or over formed STI liner and/or STI dielectric material, such that the top surface of the STI region(s) 130 are coplanar with or below a bottom surface of the bottommost sacrificial nanolayer. STI liner 128 may be composed of but not limited to a nitride, low-K nitride (i.e., a nitride material with a lower dielectric constant relative to $SiO_2$), or the like. The STI dielectric material 129 may be composed of but not limited to an oxide, low-K oxide (i.e., an oxide material with a lower dielectric constant relative to $SiO_2$), or the like. For clarity, the STI regions 130 are formed within the substrate structure and may form substrate tracks. Upon the substrate tracks the transistors 100.2, 100.4 and vertical diodes 100.6, 100.8, 100.10, and 100.12 may be formed.

The illustrated semiconductor IC device 100 may be further fabricated by next forming sacrificial gate structures (not shown). The sacrificial gate structures may include a sacrificial gate liner, a sacrificial gate, and a sacrificial gate cap. The sacrificial gate structures may be formed by initially depositing a sacrificial gate liner layer (e.g., a dielectric, oxide, or the like) upon the one or more STI regions 130 and upon and around the one or more nanolayer stacks. The sacrificial gate structures may further be formed by subsequently depositing a sacrificial gate layer (e.g., amorphous silicon, or the like) upon the sacrificial gate liner layer. The thickness of the sacrificial gate layer may be such that the top surface of the sacrificial gate layer is above the top surface of the one or more nanolayer stacks. The sacrificial gate structures may further be formed by forming a gate cap layer upon the sacrificial gate layer. The gate cap layer may be formed by depositing a mask material, such as a hard mask material, such as silicon nitride, silicon oxide, combinations thereof, or the like, upon the sacrificial gate layer. The gate cap layer may be composed of one or more layers of masking materials to protect the sacrificial gate layer and/or other underlying materials during subsequent processing of semiconductor IC device 100.

The one or more sacrificial gate structures may further be formed by patterning the gate cap layer, sacrificial gate layer, and sacrificial gate liner by, for example, using lithography and etch processes to remove undesired portions and retain desired portion(s), respectively. The retained desired portion(s) of the gate cap layer, sacrificial gate layer, and sacrificial gate liner may form the sacrificial gate liner, the sacrificial gate, and the sacrificial gate cap, respectively, of each of the one or more sacrificial gate structures.

One or more sacrificial gate structures can be formed on targeted regions or areas of semiconductor IC device 100 to define the length of one or more GAA FETs in the transistor region 111 and to provide sacrificial material for yielding targeted GAA FET structure(s) in the transistor region 111.

The illustrated semiconductor IC device 100 may be further fabricated by next removing the bottommost sacrificial nanolayer. The bottommost sacrificial nanolayer may be removed by a wet etch utilizing an etchant that targets the material of the bottommost sacrificial nanolayer selective to the respective material(s) of the sacrificial nanolayers, the active nanolayers 108, the STI region(s) 130, and/or sacrificial gate structures, as appropriate. The etch may be timed or otherwise controlled to effectively remove the bottommost sacrificial nanolayer while substantially retaining the sacrificial nanolayers, the active nanolayers 108, the STI region(s) 130, and the sacrificial gate structures, etc. The removal of bottommost sacrificial nanolayer may form a bottom isolation cavity between the substrate structure and the lowest sacrificial nanolayer.

The illustrated semiconductor IC device 100 may be further fabricated by next forming gate spacers 140 and a bottom isolation 142 in place of the removed bottommost sacrificial nanolayer within the nanolayer stacks. The gate spacer(s) 140 may be formed upon the sidewall(s) of the sacrificial gate structures, upon the STI region(s) 130, and around the one or more nanolayer stacks.

The bottom isolation 142 and the gate spacer(s) 140 may be simultaneously formed by a conformal deposition of a dielectric material, such as silicon nitride, SiBCN, SiNC, SiN, SiCO, SiNOC, or a combination thereof, or the like, within the nanolayer cavity(ies), upon STI regions 130, upon around the one or more sacrificial gate structures, and upon and around the one or more nanolayer stack(s). Subsequently, undesired portions of dielectric material may be removed while desired portions the dielectric material may be retained and thereby form the bottom isolation 142 and the gate spacer(s) 140. The undesired portions of dielectric material may be removed by a directional ion etch, such as a reactive ion etch (RIE). The RIE may remove exposed or unprotected horizontal portions of the dielectric material while retaining protected horizontal portions of the dielectric layer (e.g., the bottom isolation 142) and vertical portions of the dielectric layer (e.g., the gate spacer(s) 140).

For clarity, semiconductor IC device 100, can also be fabricated by alternative operations that result in the absence of bottom isolation 142 or operations that retain the bottommost sacrificial nanolayer while the gate spacer(s) 140 are formed. This bottommost sacrificial nanolayer may be subsequently removed during the removal of the sacrificial nanolayers and the bottom isolation 142 may be formed along with the inner spacers 144.

The illustrated semiconductor IC device 100 may be further fabricated by next forming recesses within the one or more nanolayer stacks between gate spacers 140 of neighboring sacrificial gate structures. In other words, a single nanolayer stack may be separated, by one or more recesses, into multiple nanolayer stacks each located underneath at a portion of respective sacrificial gate structure and associated gate spacers 140.

The one or more recesses may be formed between adjacent sacrificial gate structures by removing respective portions of the sacrificial nanolayers and active nanolayers 108 that are between gate spacers 140 of adjacent or neighboring sacrificial gate structures. The one or more S/D recesses may be formed to a depth to stop at the top surface of the substrate structure (e.g., the top surface of upper substrate 102, or the like), the top surface of STI regions 130, or the like. Alternatively, the one or more S/D recesses may be formed to a depth within the upper substrate 102 above the etch stop layer 103.

The undesired portions of sacrificial nanolayers, active nanolayers 108, and the like, may be removed by etching or other subtractive removal techniques. The top surface of the substrate structure may be used as an etch stop or other etch parameters may be controlled to stop the material removal at the substrate structure. As the gate spacers 140 and the sacrificial gate structures may be utilized to protect the underlying portions of sacrificial nanolayers, active nanolayers 108, and bottom isolation 142 (if present), respective sidewalls of the nanolayer stacks may be substantially coplanar and substantially vertical with the outer sidewalls of the gate spacers 140 there above.

As used herein, "substantially vertical" sidewalls deviate from a direction normal to a major surface (e.g., top surface, etc.) of the substrate 102 by less than 5°, e.g., 0°, 1°, 2°, 3°, 4°, or 5°, including ranges between any of the foregoing values.

The illustrated semiconductor IC device 100 may be further fabricated by next forming horizontal or lateral indents by laterally or horizontally removing respective portions of sacrificial nanolayers within the nanolayer stacks. The indents may be formed by a reactive ion etch (RIE) process, which can remove portions of the sacrificial nanolayers. The horizontal depth of the indents may be chosen to set a length for a replacement gate structure 170, shown in FIG. 2, that is formed in place of one sacrificial gate structure. When the sacrificial nanolayers are composed of SiGe and when active nanolayers 108 are Si, the directional RIE can use a boron-based chemistry or a chlorine-based chemistry, for example, which recesses or removes the exposed end portions of sacrificial nanolayers (e.g., end portions of sacrificial nanolayers generally below spacer 140) selective to the Si active nanolayers 108. In alternative implementations when sacrificial nanolayers are not SiGe and when active nanolayers 108 are not Si, the directional etch of the sacrificial nanolayers may generally be selective to the active nanolayers 108, gate spacers 140, STI regions 130, and/or substrate structure.

The illustrated semiconductor IC device 100 may be further fabricated by next forming a respective inner spacer 144 within each indent. The one or more inner spacers 144 can be formed by ALD or CVD or any other suitable deposition technique that deposits a dielectric material within the indent(s), thereby forming the inner spacer(s). In some examples, the inner spacer(s) 144 are composed of a low-K dielectric material (a material with a lower dielectric constant relative to $SiO_2$), SiN, SiO, SiBCN, SiOCN, SiCO, etc. or any other suitable dielectric material. In certain implementations, after the formation of the inner spacer(s) 144, an isotropic etch process is performed to create substantially vertical sidewalls of the inner spacer(s) 144 that are coplanar with the substantially vertical sidewalls of the active nanolayers 108, of the gate spacers 140, and/or of the bottom isolation 142.

The illustrated semiconductor IC device 100 may be further fabricated by next forming one or more backside contact placeholders 162 within the substrate structure within the transistor region 111 in between adjacent sacrificial gate structures within a respective recess. In one example, a respective backside contact placeholder 162 may be formed in all recess location(s) within the transistor region 111 such that a respective backside contact placeholder 162 is located underneath each S/D region 164 within the transistor region 111.

If the recesses are not of sufficient depth, the one or more backside contact placeholders 162 may be formed by forming one or more backside contact placeholder cavities within the substrate structure generally in between adjacent sacrificial gate structures and below the prior respective one or more recesses. For example, the one or more backside contact placeholder(s) cavities may be formed by a subtractive removal technique, such as an etch, that removes associated portion(s) of the upper substrate 102. The etch may be timed or otherwise controlled to stop the removal of the upper substrate 102 such that the depth or bottom of the one or more backside contact placeholder(s) cavities are above the etch stop layer 103.

The one or more backside contact placeholders 162 may be further formed by epitaxially growing an epitaxial material from exposed substrate structure surface(s) within the one or more backside contact placeholder(s) cavities. In some embodiments, epitaxial growth and/or deposition processes may be selective to forming on the semiconductor surfaces of the upper substrate 102, and may not deposit material on dielectric surfaces, such as silicon dioxide or silicon nitride surfaces. In some embodiments, the epitaxial growth of the one or more backside contact placeholders 162 may overgrow above the top surface of the substrate structure or above the top surface of bottom isolation 142. In an example, the epitaxial material of the one or more backside contact placeholders 162 may be chosen to be etch selective to the material of the S/D region(s) 164, the material of the upper substrate 102, or the like.

In another example, a separation layer 163 (e.g., a Si epitaxially grown layer, or the like) may be formed upon the top surface of the backside contact placeholders 162. For example, the one or more backside contact placeholders 162 may be SiGe and a Si separation layer 163 may be epitaxially grown from the top surface of the SiGe backside contact placeholders 162. Respective top surfaces of the backside contact placeholders 162 (or separation layer 163 thereupon) may be substantially horizontal and below the bottom surface of the bottommost active nanolayer 108 (e.g., to enable contact between such active nanolayer 108 and the S/D region 164) and/or substantially coplanar with a respective one or more top surface(s) of bottom isolation 142.

The illustrated semiconductor IC device 100 may be further fabricated by next forming one or more respective S/D regions 164 upon a respective backside contact placeholder 162 within the transistor region 111 and by forming one or more top doped diode regions 164' in the diode region 113. For example, p-doped S/D regions 164 and/or p-doped top doped diode regions 164' may be simultaneously formed in a first formation sequence and then n-doped S/D regions 164 and/or n-doped top doped diode regions 164' may be simultaneously formed in a second formation sequence, or vice versa.

Each S/D region 164 may form either a source or a drain, respectively, of respective transistors 100.2, 100.4 and is connected to respective end surface of the active nanolayers 108 of a nanolayer stack. Similarly, each top doped diode region 164' may form a top doped region, respectively, of respective vertical diodes 100.6, 100.8, 100.10, and 100.12 and may be connected to respective end surfaces of the active nanolayers 108 of a nanolayer stack. For clarity, after subsequent processing, the active nanolayers 108 within the diode region 113 are operationally different than those in the transistor region 111. As describe below, the active nanolayers 108 within the diode region 113 are inactive since charge carriers (e.g., holes or electrons) do not flow therethrough and are therefore referred to as inactive nanolayers 108' even though they are structurally substantially the same as the active nanolayers 108 in the transistor region 111.

Each S/D region 164 and each top doped diode region 164' is composed of a semiconductor material and a dopant. As used herein, a "source/drain" region can be a source region or a drain region depending on subsequent wiring and application of voltages during operation of the applicable transistor.

The semiconductor material that provides each of the S/D regions 164 and the top doped diode regions 164' may be composed of one of the semiconductor materials mentioned above for the semiconductor structure. For example, the semiconductor material that provides the S/D region 164 and top doped diode regions 164' can be compositionally the same, or compositionally different from each active nanolayer 108. The dopant that is present in the S/D regions 164 and top doped diode regions 164' can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "n-type" refers to the addition of impurities that contributes free electrons to an intrinsic semiconductor. In a silicon containing semiconductor material, examples of n-type dopants, include, but are not limited to, antimony, arsenic and phosphorous. In one example, the S/D regions 164 and the top doped diode regions 164' can have a dopant concentration of from $4\times10^{20}$ atoms/$cm^3$ to $3\times10^{21}$ atoms/$cm^3$. When the semiconductor material is doped with a p-type dopant, the resulting S/D regions 164 and top doped diode regions 164' are referred to herein as being p-doped and when the semiconductor material is doped with a n-type dopant, the resulting S/D regions 164 and top doped diode regions 164' are referred to herein as being n-doped.

The S/D regions 164 and the top doped diode regions 164' may be epitaxially grown or formed. In some examples, the S/D regions 164 and the top doped diode regions 164' are formed by in-situ doped epitaxial growth. The use of an in-situ doping process is merely an example. For instance, one may instead employ an ex-situ process to introduce dopants into the S/D regions 164 and the top doped diode regions 164'. Other doping techniques can be used to incorporate dopants in the S/D regions 164 and the top doped diode regions 164'. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In examples, S/D epitaxial growth conditions promote in-situ Boron doped SiGe for p-type transistor and phosphorus or arsenic doped silicon or Si:C for n-type transistors.

In some examples, the epitaxial growth that forms the S/D region 164 and the top doped diode regions 164' occurs or is promoted from the top surface of upper substrate 102, from the upper surface of backside contact placeholders 162 (or separation layer 163 thereupon), or the like, while epitaxial growth may be limited or does not occur from neighboring STI regions 130.

In some embodiments, epitaxial growth to form the one or more S/D regions 164 and the top doped diode regions 164' may overgrow above the upper surface of the sacrificial gate structure(s) and be subsequently recessed such that the top surface of the S/D region 164 and the top doped diode regions 164' may be substantially horizontal and above the top surface of the topmost active nanolayer 108 or inactive nanolayers 108', respectively, within the nanolayer stacks (e.g., to enable contact between the end surface of that active nanolayer 108 and the S/D region 164).

The illustrated semiconductor IC device 100 may be further fabricated by next forming interlayer dielectric (ILD) 176. For example, a blanket ILD 176 may be deposited over the S/D region(s) 164, over the top doped diode regions 164', over the STI region(s) 130, over the sacrificial gate structures, and over the gate spacers 140, and the like.

The ILD 176 can be any suitable material, such as, for example, porous silicates, carbon doped oxides, silicon dioxides, silicon nitrides, silicon oxynitrides, OPL, or other dielectric materials. Any known manner of forming the ILD 176 can be utilized. The ILD 176 can be formed using, for example, CVD, PECVD, ALD, flowable CVD, spin-on dielectrics, or PVD.

In an example, the ILD 176 may be formed to a thickness above the top surface of the sacrificial gate structures. Subsequently, a planarization process, such as a CMP, may be performed to remove excess ILD 176 material and to remove the sacrificial gate caps of the sacrificial gate structures, thereby exposing the sacrificial gate thereunder. The planarization may also partially remove some of the sacrificial gates or may at least expose the sacrificial gate of the sacrificial gate structures. The CMP may create a substantially planar or substantially horizontal top surface for the semiconductor IC device 100. In other words, the respective top surfaces of ILD 176, gate spacers 140, sacrificial gates, S/D regions 164, the top doped diode regions 164', etc. may be substantially coplanar and/or substantially horizontal.

The illustrated semiconductor IC device 100 may be further fabricated by next removing the sacrificial gate structures and then forming replacement gate structures 170 and inactive replacement gate structures 170' in place thereof. The replacement gate structures 170 are generally formed within transistor region 111 and the inactive replacement gate structures 170' are generally formed within the diode region 113. For clarity, after subsequent processing, the inactive replacement gate structures 170' within the diode region 113 are operationally different than replacement gate structures 170 in the transistor region 111. As describe below, unlike the replacement gate structures 170, the inactive replacement gate structures 170' within the diode region 113 are inactive since they are electrically isolated in that they are not subjected to sufficient potential to cause charge carriers to flow through the inactive nanolayers 108' associated therewith. Therefore, the inactive replacement gate structures 170' are referred to as inactive even though they are structurally substantially the same as the replacement gate structures 170 in the transistor region 111.

The sacrificial gate structures may be removed by initially removing the sacrificial gate and sacrificial gate oxide by a removal technique, such as one or more series of etches. For example, such removal may be accomplished by a wet chemical etching process in which one or more chemical etchants are used to remove the sacrificial gate and sacrificial gate oxide of the sacrificial gate structures. Appropriate etchants may be used that remove the sacrificial gate and/or sacrificial gate oxide selective to the active nanolayers 108, inactive nanolayers 108', inner spacers 144, gate spacers 140, the bottom isolation 142, STI regions 130, or the like. For clarity, the removal of the sacrificial gate structure may further remove the sacrificial gate, sacrificial gate oxide, or the like.

Next, or simultaneously, the active nanolayers 108 and inactive nanolayers 108' may be released by removing the sacrificial nanolayers within the nanolayer stacks. The sacrificial nanolayers may be removed by a removal technique, such as one or more series of etches. For example, the etching can include a wet chemical etching process in which one or more chemical etchants are used to remove the sacrificial nanolayers. Appropriate etchants may be used that remove the sacrificial nanolayers selective to the active nanolayers 108, inactive nanolayers 108', inner spacers 144, the bottom isolation 142, gate spacers 140, or the like. After the removal of sacrificial nanolayers, void spaces may be formed above and/or below the active nanolayers 108 and inactive nanolayers 108'.

The illustrated semiconductor IC device 100 may be further fabricated by next forming a replacement gate structure 170 in place of the removed sacrificial gate structures around the active nanolayers 108, upon STI region(s) 130, upon the bottom isolation 142, etc. in the transistor region 111 and with forming an inactive replacement gate structure 170' in place of the removed sacrificial gate structures around the inactive nanolayers 108', upon STI region(s) 130, upon the bottom isolation 142, etc. in the diode region 113.

Replacement gate structure(s) 170 may be formed by initially forming an interfacial layer on the gate spacers 140, on the active nanolayers 108, on the bottom isolation 142, on the inner spacers 144, etc. that are interior to and/or upon the respective surfaces interior to the opening created by the removal of the sacrificial gate structure and the releasing of the active nanolayers 108. Similarly, inactive replacement gate structure(s) 170' may be formed by initially forming an interfacial layer on the gate spacers 140, on the inactive nanolayers 108, on the bottom isolation 142, on the inner spacers 146, etc. that are interior to and/or upon the respective surfaces interior to the opening created by the removal of the sacrificial gate structure and the releasing of the inactive nanolayers 108'. The interfacial layer can be deposited by any suitable techniques, such as ALD, CVD, PVD, thermal oxidation, combinations thereof, or other suitable techniques.

The replacement gate structure(s) 170 and the inactive replacement gate structure(s) 170' may be further formed by forming a high-K layer to cover the exposed surfaces of the interfacial layer. The high-K layer can be deposited by any suitable techniques, such as ALD, CVD, metal-organic CVD (MOCVD), PVD, thermal oxidation, combinations thereof, or other suitable techniques. A high-K material is a material with a higher dielectric constant than that of $SiO_2$, and can include e.g., LaO, AlO, ZrO, TiO, $Ta_2O_5$, $Y_2O_3$, $SrTiO_3$ (STO), $BaTiO_3$(BTO), BaZrO, HfZrO, HfLaO, HfSiO, LaSiO, AlSiO, HfTaO, HfTiO, (Ba,Sr) $TiO_3$(BST), $Al_2O_3$, $Si_3N_4$, oxynitrides (SiON), or other suitable materials. The high-K layer can include a single layer or multiple layers, such as metal layer, liner layer, wetting layer, and adhesion layer. In other embodiments, the high-k layer can include, e.g., Ti, Ag, Al, TiAlN, TaC, TaCN, TaSiN, Mn, Zr, TiN, TaN, Ru, Mo, Al, WN, Cu, W, or any suitable materials.

The replacement gate structure(s) 170 and the inactive replacement gate structure(s) 170' may be further formed by depositing a work function (WF) gate upon the high-K layer. The WF gate can be comprised of a conductor or metal, such as, e.g., copper (Cu), cobalt (Co), aluminum (Al), platinum (Pt), gold (Au), tungsten (W), titanium (Ti), nitride ($N^{3-}$) or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. In general, the WF gate sets the threshold voltage (Vt) of the device. The high-K layer may separate the WF gate from the nanolayer channel (i.e., active nanolayer 108). Other metals may be desired to further fine tune the effective work function (eWF) and/or to achieve a desired resistance value associated with current flow through the gate in the direction parallel to the plane of the nanolayer channel.

The replacement gate structure(s) 170 and the inactive replacement gate structure(s) 170' may be further formed by depositing a conductive gate 172. In an example, when none of the previous replacement gate material(s) are utilized in the replacement gate structures, the conductive gate may be formed upon the same or similar surfaces as those upon which the interfacial layer, described above, may be formed. In other examples, when one or more of the interfacial layer, the high-K layer, the WF gate, or the like, are utilized in the replacement gate structures, the conductive gate may be formed upon the most recent structural formation thereof.

The conductive gate 172 can be comprised of a conductor material and/or metal, such as but not limited to, e.g., tungsten, aluminum, ruthenium, rhodium, cobalt, copper, tantalum, titanium, carbon nanowire materials including graphene, or the like. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. After the replacement gate structure 170 and the inactive replacement gate structure(s) 170' formation, the top surface of the semiconductor IC device 100 may be planarized by a planarization technique such as a CMP, mechanical grinding process, or the like. After the planarization technique, respective top surfaces of the ILD 176, gate spacers 140, replacement gate structures 170, inactive replacement gate structure(s) 170', or the like, may be substantially horizontal and/or may be substantially coplanar.

The illustrated semiconductor IC device 100 may be further fabricated by next forming a frontside contact ILD 176.1. The frontside contact ILD 176.1 may be formed upon respective top surfaces of replacement gate structure(s) 170, the inactive replacement gate structure(s) 170', ILD 176, and gate spacers 140. The frontside contact ILD 176.1 may be formed by depositing a dielectric material, such as, for example, porous silicates, carbon doped oxides, silicon dioxides, silicon nitrides, silicon oxynitrides, or other dielectric materials. Any appropriate deposition technique for forming the frontside contact ILD 176.1 can be utilized. The frontside contact ILD 176.1 can be formed using, for example, CVD, PECVD, ALD, flowable CVD, spin-on dielectrics, or PVD.

The illustrated semiconductor IC device 100 may be further fabricated by next forming frontside contacts 180 within the frontside contact ILD 176.1 and the ILD 176. The frontside contacts 180 may be formed by patterning respective frontside contact openings within frontside contact ILD 176.1 and ILD 176, respectively, from the frontside (i.e., from above the semiconductor IC device 100, as depicted, downward to respective structures thereof). The frontside contact 180 may be in direct or indirect physical and electrical contact and/or may physically meld with respective material(s) of one or more regions of the semiconductor IC device 100. For example, an illustrated frontside contact 180 is in direct contact with S/D region 164 of transistor 100.2. As depicted in FIG. 2, a respective frontside contact 180 may be in direct contact with a particular replacement gate structure 170. For clarity, particular frontside contact(s) 180 within diode region 113 may not be formed in association with the inactive replacement gate structure(s) 170' therein.

The frontside contacts 180 may be formed by initially forming frontside contact opening(s). The frontside contact opening(s) may be formed by the same or shared lithography and etch process(es) or by sequential lithography and etch processes. In such process(es), a mask may be applied and patterned. An opening in the patterned mask may expose the portion of the underlying contact ILD 176.1 and ILD 176 to be removed while other protected portions of semiconductor IC device 100 thereunder may be protected and retained. In such process(es), the dry and wet etching processes can have etching parameters that can be tuned, such as etchants used, etching temperature, etching solution concentration, etching pressure, source power, RF bias voltage, RF bias power, etchant flow rate, to promote desired material removal and desired material retention. Generally, the frontside contact openings expose at least a portion of the underlying semiconductor IC device 100 structure that the associated frontside contact 180 is to make direct contact therewith.

The frontside contact(s) 180 may be further formed by depositing conductive material such as metal into the respective frontside contact opening(s). In an example, frontside contact(s) 180 may be formed by depositing a liner, such as Ni, NiPt or Ti, etc. into the contact opening(s), depositing an adhesion liner, such as TiN, TaN, etc. upon the liner, and by depositing a conductive fill, such as Al, Ru, W, Co, Cu, etc. upon the metal adhesion liner. Subsequently, a planarization process, such as a CMP process or a mechanical grinding process, may remove excess portions of the liner, the metal adhesion liner, and the conductive fill. Subsequently, the respective top surfaces of frontside contact(s) 180 and the frontside contact ILD 176.1 may be substantially horizontal and/or substantially coplanar. In embodiments, the frontside contact(s) 180 are fabricated in middle-of-line (MOL) fabrication operations and may be illustrations of MOL frontside contacts.

In the semiconductor IC device fabrication industry, there are three sections referred to in a build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices.

Figure 13:
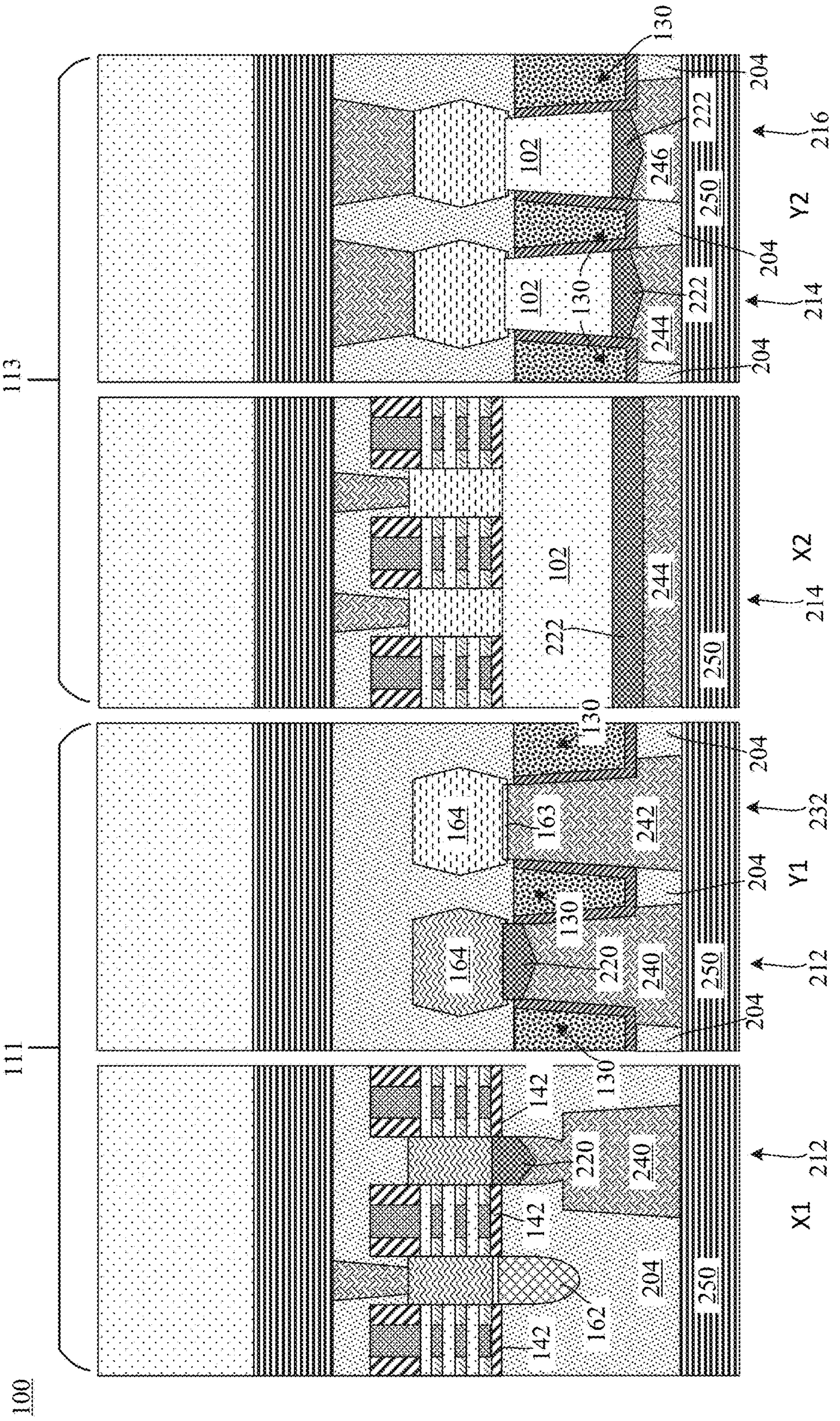

BEOL is the second portion of IC fabrication where the individual devices (e.g., transistors, capacitors, resistors, etc.) become interconnected with wiring on the semiconductor IC device, e.g., the metallization layer or layers of a wafer. BEOL includes contacts, insulating layers (dielectrics), metal levels, and bonding sites for chip-to-package connections. In the BEOL, part of the fabrication stage contacts (pads), interconnect wires, vias and dielectric structures are formed. For modern IC processes, more than one metal layers may be added in the BEOL. In the present example, there are multiple BEOL levels each on opposites sides of the semiconductor IC device 100. First, a frontside BEOL network 182 is formed on the frontside of the semiconductor device 100. Subsequently, a backside BEOL network 250, as depicted in FIG. 13, is formed.

In the depicted example, the frontside BEOL network 182 is formed over the contact ILD 176.1 and upon the frontside contacts 180. Respective wires within the frontside BEOL network 182 may be electrically connected to the one or more S/D regions 164, to the one or more top doped diode regions 164', to the one or more replacement gate structure(s) 170, or the like, by a respective frontside contact(s) 180. For example, respective wire(s) within the frontside BEOL network 182 may be electrically connected to appropriate S/D regions 164 by a frontside contact 180, another and different group of respective wire(s) within the frontside BEOL network 182 may be electrically connected to appropriate replacement gate structures 170, and another and different group of respective wire(s) within the frontside BEOL network 182 may be electrically connected to appropriate top doped diode regions 164'.

In different implementations, the frontside contacts 180 may take the form of BEOL interconnects. In these implementations, the respective wires within the frontside BEOL network 182 may be electrically connected to the S/D regions 164, top doped diode regions 164', replacement gate structure(s) 170, or the like, by a lowest BEOL interconnect, such as a vertical interconnect access (VIA), that is within the frontside BEOL network 182.

The frontside BEOL network 182 is located directly on the frontside surface of the MOL structure (e.g., contact ILD 176.1, frontside contact(s) 180, etc.). The frontside BEOL network 182 can include one or more interconnect dielectric material layers (including one of the dielectric materials mentioned above for the frontside ILD 176) and contains metal wires (the metal wires can be composed of any electrically conductive metal or electrically conductive metal alloy) embedded therein. In some embodiments, the frontside metal wires within the frontside BEOL network 182 are composed of Cu. The frontside BEOL network 182 can include "x" numbers of frontside metal levels, wherein "x" is an integer starting from 1. The frontside BEOL network 182 may further contain conductive pads that are connected to one or more of the metal wires and may be used to connect the semiconductor IC device 100 to an external and/or higher-level structure, such as a chip carrier, motherboard, or the like.

The illustrated semiconductor IC device 100 may be further fabricated by next bonding carrier wafer 184 to the frontside BEOL network 182. The carrier wafer 184 can include one of the semiconductor materials mentioned above for the semiconductor structure and the carrier wafer 184 may be attached to the semiconductor IC device 100 by a wafer-to-wafer bonding technique.

Figure 4:
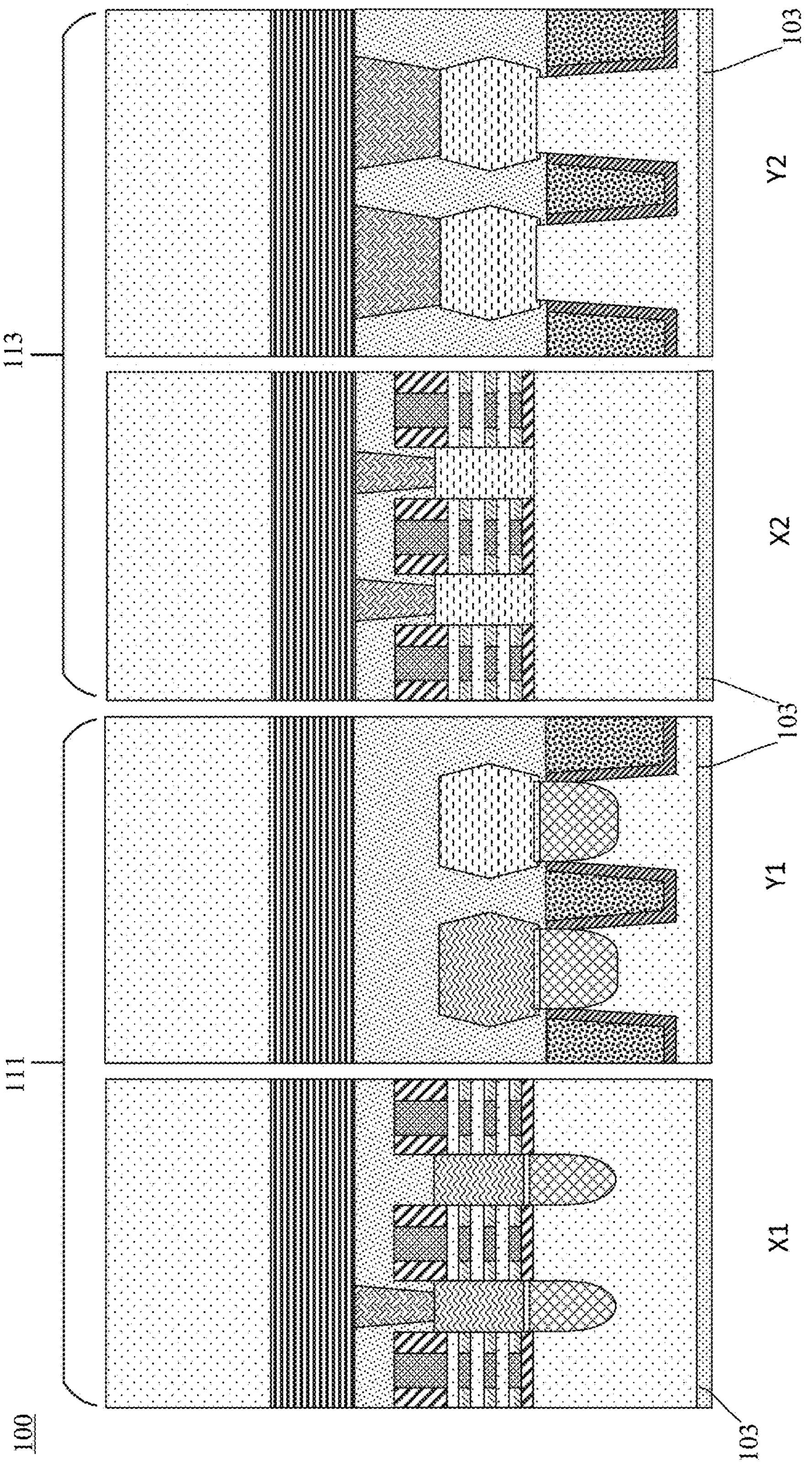

FIG. 4 depicts cross-sectional views of the semiconductor IC device 100 after fabrication operations, in accordance with embodiments of the present disclosure. In the depicted fabrication stages, the substrate structure may be recessed. For example, the lower substrate 101 may be removed.

The substrate structure may be recessed by flipping the semiconductor IC device 100 and removing the lower substrate 101 using any removal technique, such as a combination of wafer grinding, CMP, dry, and/or wet etch. In the example depicted, lower substrate 101 is removed by an etch that utilizes etch stop layer 103 as the etch stop. In this example, removal of lower substrate 101 exposes the bottom surface of etch stop layer 103.

Figure 5:
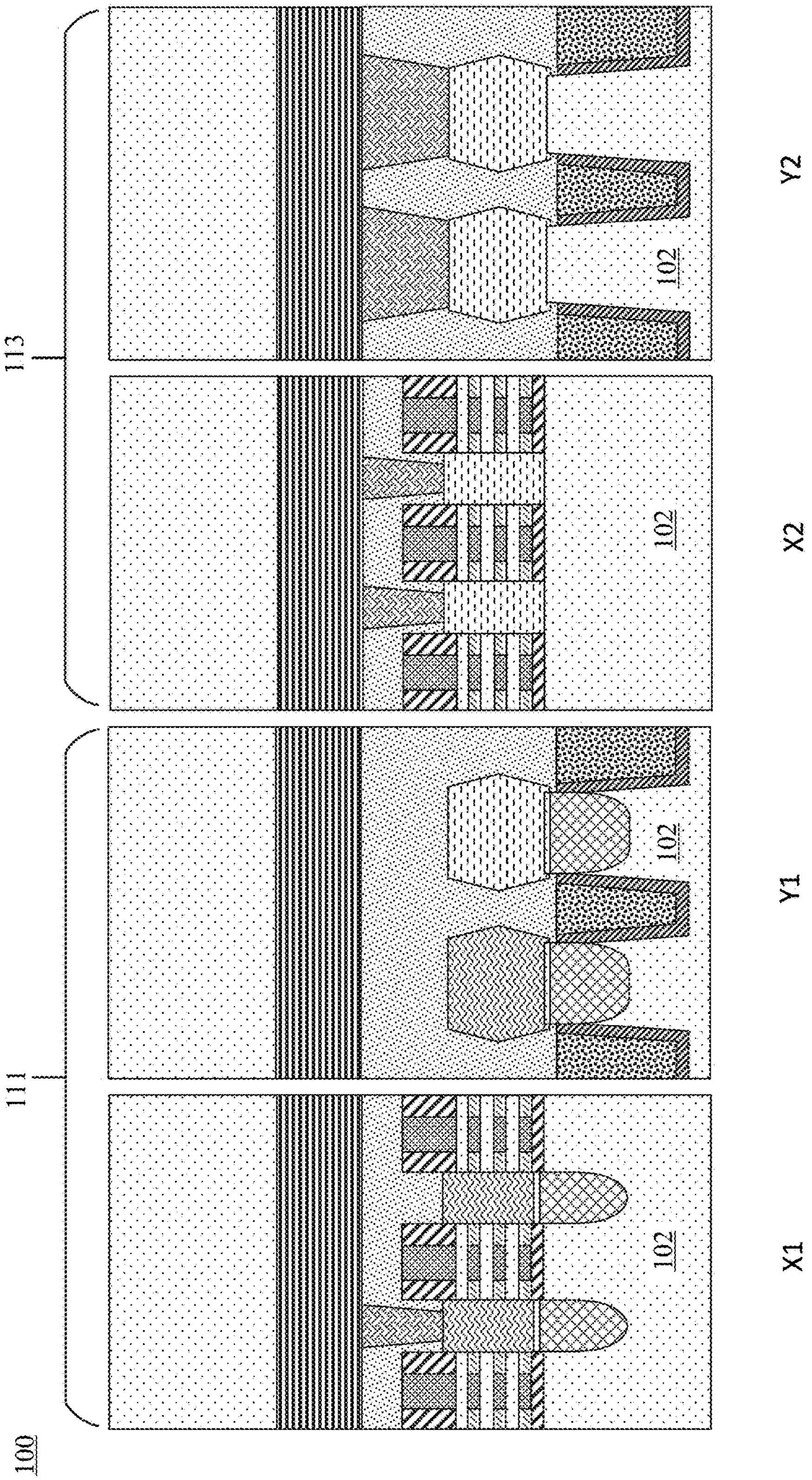

FIG. 5 depicts cross-sectional views of the semiconductor IC device 100 after fabrication operations, in accordance with embodiments of the present disclosure. In the depicted fabrication stages, the substrate structure may be further removed. For example, etch stop layer 103 may be removed.

The etch stop layer 103 may be removed by a subtractive removal technique such as a CMP, dry and/or wet etch. Upon removal of the etch stop layer 103, the bottom surface upper substrate 102 is exposed. The removal of etch stop layer 103 may be selective to the material of upper substrate 102. For example, etch stop layer 103 is removed by an etch that utilizes upper substrate 102 as the etch stop.

Figure 6:
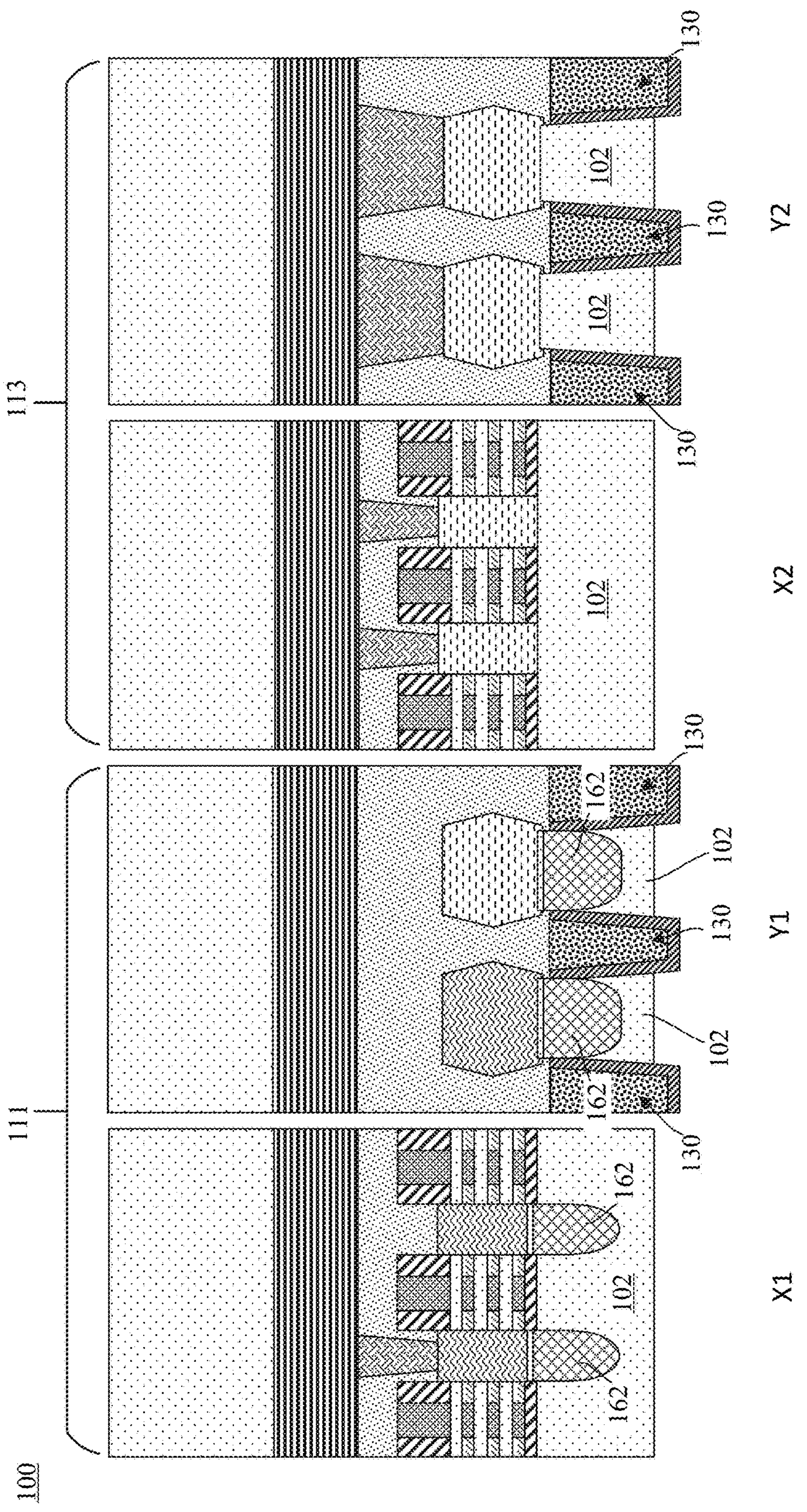

FIG. 6 depicts cross-sectional views of the semiconductor IC device 100 after fabrication operations, in accordance with embodiments of the present disclosure. In the depicted fabrication stages, the substrate structure may be further removed. For example, upper substrate 102 may be partially recessed.

The upper substrate 102 may recessed by an appropriate substrative removal technique, such as an etch, that removes associated portion(s) of the upper substrate 102. The etch may be timed or otherwise controlled to remove the material of substrate 102 selective to the STI regions 130, or the like. Upon the partial removal of the upper substrate 102, respective portions of the STI regions 130 may be exposed. In an example, upper substrate 102 is removed by an etch that utilizes STI regions 130 as the etch stop. In another example, the etch that recesses upper substrate 102 may be controlled such that the depth of such etch results in the bottom surface of upper substrate 102 to be between the bottom surface and top surface of the STI region(s) 130. In this example, as depicted, the etch that recesses upper substrate 102 may be controlled such that the depth of such etch results in the bottom surface of upper substrate 102 to be between the bottom surface of the backside contact placeholders 162 and top surface of the STI region(s) 130.

Figure 7:
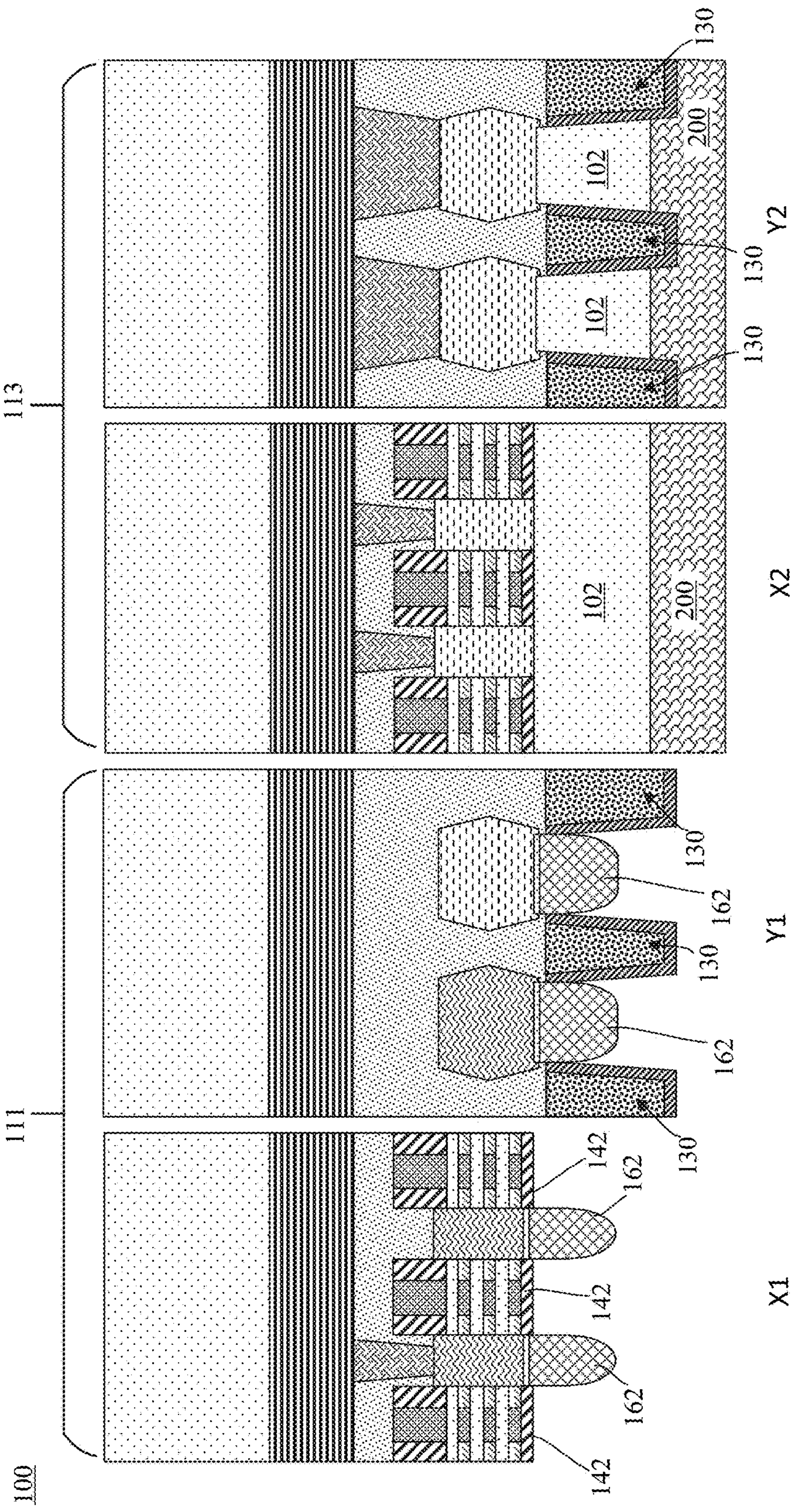

FIG. 7 depicts cross-sectional views of semiconductor IC device 100 shown after illustrative fabrication operation(s), in accordance with one or more embodiments. In the depicted fabrication stage, diode region 113 is protected while the substrate structure is removed in the transistor region 111.

The substrate structure may be removed in the transistor region 111 by a lithography and etch process(es), or sequential etch processes. In such process(es), a mask 200 may be applied to the backside of semiconductor IC device 100 and patterned. The mask 210 may be removed in the transistor region 111 which may expose the upper substrate 102 to be removed while the upper substrate 102 within diode region 113 is protected and retained. With the transistor region 111 exposed, the remaining upper substrate 102 therein may be removed by an appropriate substrative removal technique, such as an etch. The etch may be timed or otherwise controlled to remove the material of substrate 102 selective to the STI regions 130, to the backside contact placeholders 162, to the bottom isolation 142, or the like. Subsequently, the mask 200 may be removed by an etch, OPL ash, or the like, which may again expose the upper substrate 102 and STI regions 130 within the diode region 113.

Figure 8:
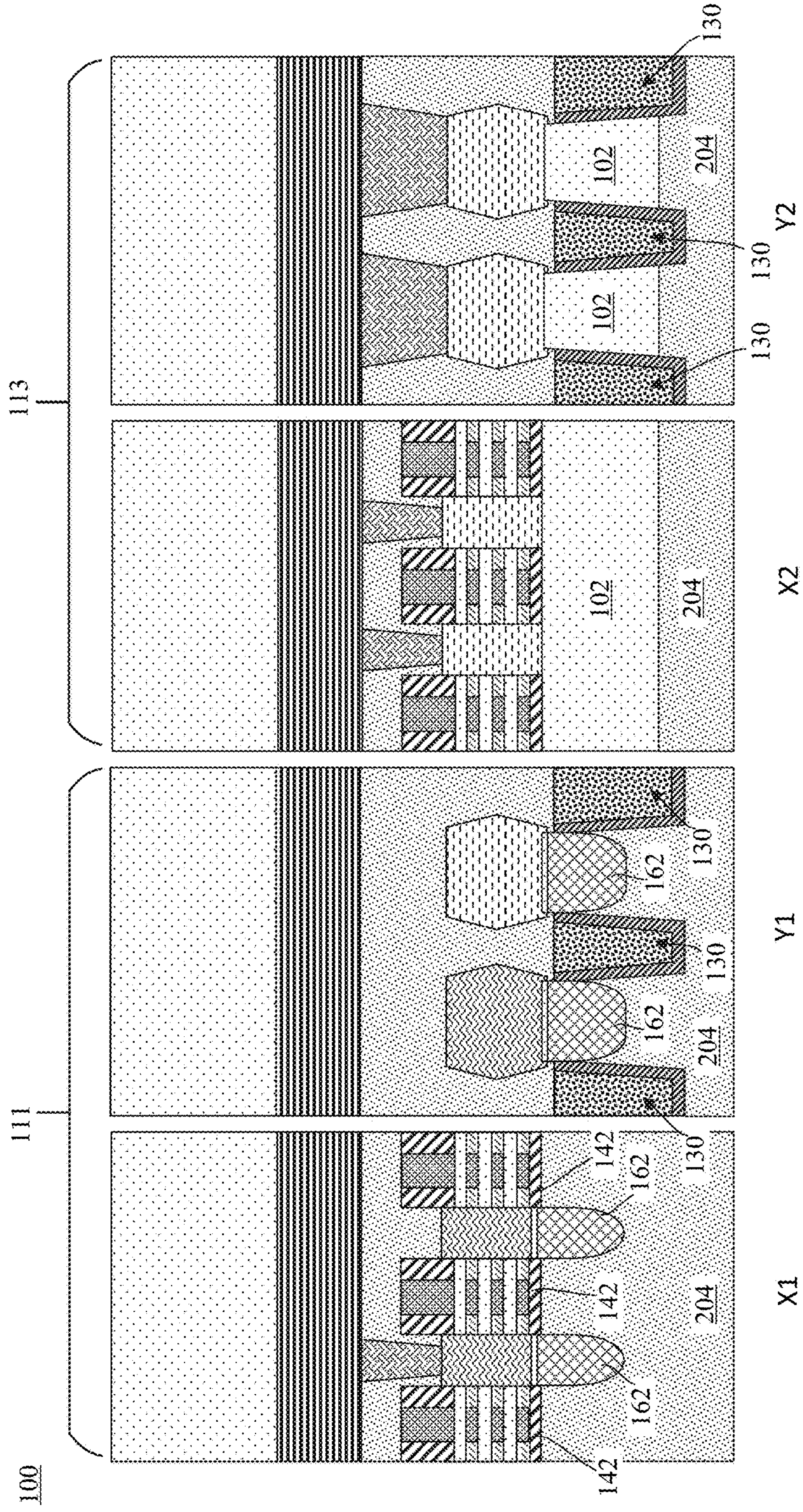

FIG. 8 depicts cross-sectional views of semiconductor IC device 100 shown after illustrative fabrication operation(s), in accordance with one or more embodiments. In the depicted fabrication stage, backside ILD 204 may be formed upon the exposed backside of the semiconductor IC device 100.

The backside ILD 204 may be formed upon the respective exposed backside surfaces of the STI regions 130, the backside contact placeholder(s) 162, the bottom isolation 142, the upper substrate 102, and the like. The backside ILD 204 may be formed by depositing a dielectric material, such as, for example, porous silicates, carbon doped oxides, silicon dioxides, silicon nitrides, silicon oxynitrides, or other dielectric materials. Any appropriate deposition technique for forming the backside ILD 204 can be utilized. The backside ILD 204 can be formed using, for example, CVD, PECVD, ALD, flowable CVD, spin-on dielectrics, or PVD. In an example, the backside ILD 204 may be formed to a thickness below the respective bottom surfaces of the STI regions 130.

Figure 9:
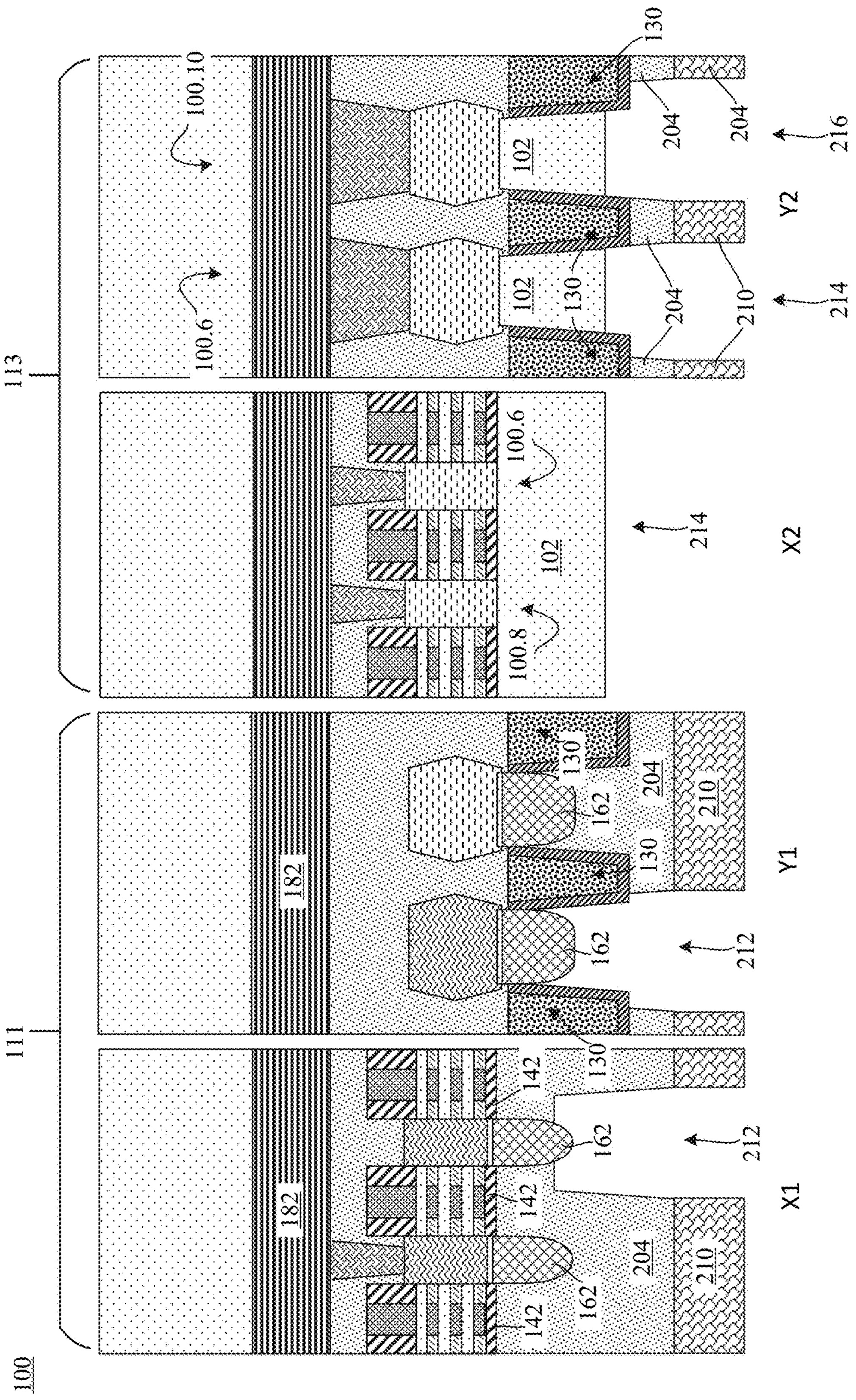

FIG. 9 depicts cross-sectional views of semiconductor IC device 100 shown after illustrative fabrication operation(s), in accordance with one or more embodiments. In the depicted fabrication stage, backside contact openings 212, 214, 216, and the like, may be formed. The backside contact openings 212, 214, 216 may be formed by the same or shared lithography and etch process(es), or sequential lithography and etch processes. In such process(es), a mask 210 may be applied to the backside of the semiconductor IC device 100 and patterned. Openings in the patterned mask may sequentially expose the portion(s) of the underlying STI region(s) 130, expose the backside ILD 204, and expose the underlying backside contact placeholder 162 that are to be removed while other protected portions of semiconductor IC device 100 may be protected and retained.

The backside contact opening 212 may be formed to expose the associated backside contact placeholder 162 there above (e.g., the backside contact placeholder 162 that is below a S/D region 164 that is not connected to the frontside BEOL network 182). Similarly, the backside contact opening 214 may be formed to expose the section of the upper substrate 102 there above that was utilized to form structure(s) of the vertical diode 100.6 and to form structure(s) of the vertical diode 100.8. Likewise, the backside contact opening 216 may be formed to expose the section of the upper substrate 102 there above that was utilized to form structure(s) of the vertical diode 100.10.

Subsequently, the backside contact placeholder(s) 162 and associated etch stop layer 103 (if present) within the transistor region 111 that are exposed by a respective backside contact openings may be removed.

The backside contact placeholder(s) 162 that are exposed by respective backside contact openings, such as backside contact opening 212, may be removed by a substrative removal technique, such as an etch. In one example, the entire applicable contact placeholder(s) 162 may be removed. In another example, the lower portion of the backside contact placeholder is removed using the separation layer 163 as an etch stop to protect the S/D region 164 there above. Subsequently, associated separation layer(s) 163 may also be removed thereby exposing at least a portion of the S/D region(s) 164 there above. Optionally, the exposed S/D region(s) 164 may be at least partially gouged such that a portion of the expose S/D region 164 is removed by a subtractive removal technique, such as an etch.

For clarity, the backside contact placeholder(s) 162 that are exposed by respective backside contact opening(s) and removed at the present fabrication stage may further be those backside contact placeholder(s) 162 that are underneath S/D region 164 that are oppositely doped relative to at least a first group of top doped diode regions 164' within diode region 113. For example, if the first group of top doped diode regions 164' within diode region 113 are n-doped regions, then those backside contact placeholder(s) 162 that are underneath p-doped S/D regions 164 and that are not connected to the frontside BEOL network 182 may be removed at the present fabrication stage, as depicted.

Figure 10:
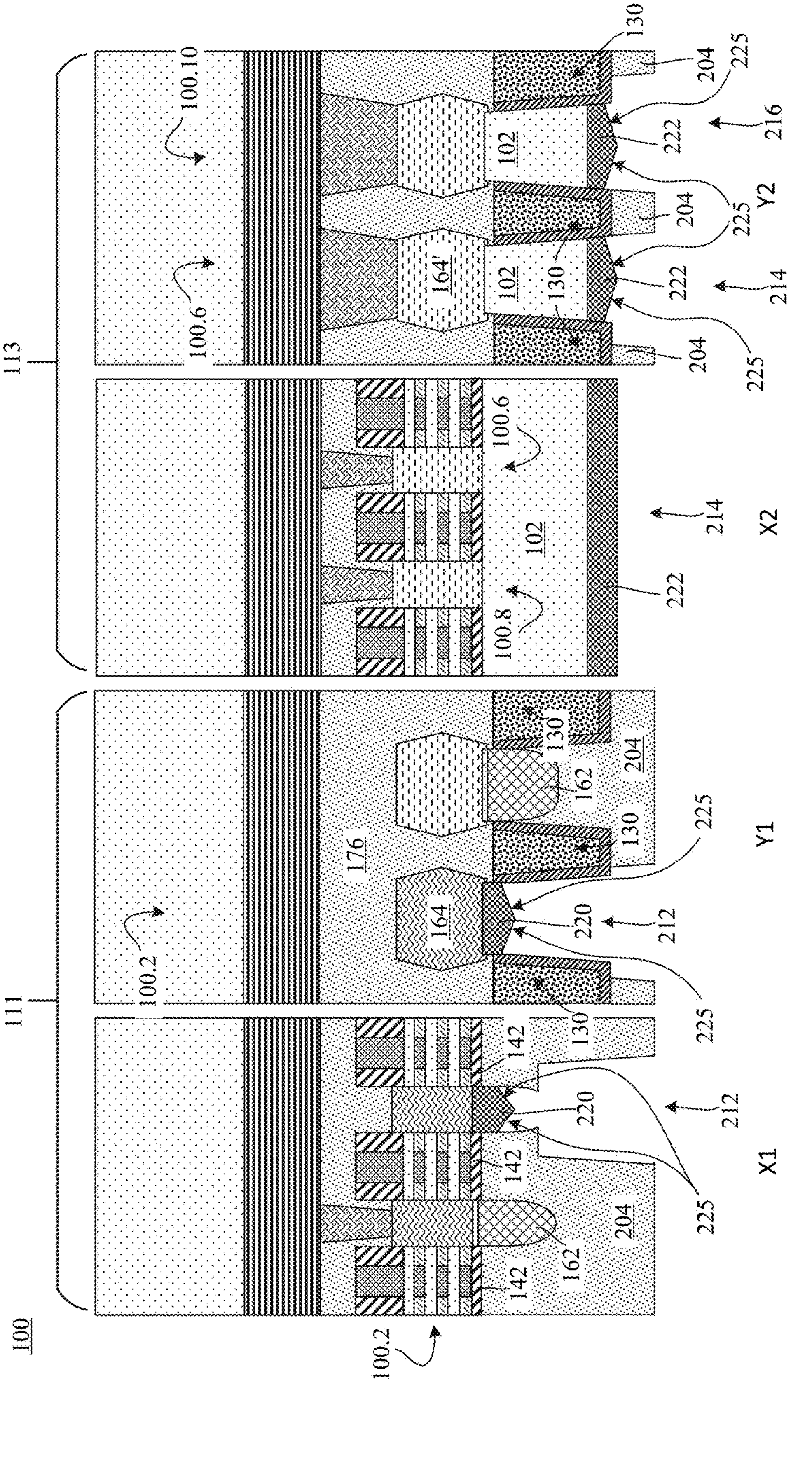

FIG. 10 depicts cross-sectional views of semiconductor IC device 100 shown after illustrative fabrication operation(s), in accordance with one or more embodiments. In the depicted fabrication stage, bottom S/D region(s) 220 are formed in the transistor region 111 and bottom doped diode region(s) 222 are formed in the diode region 113. For example, the bottom S/D region(s) 220 and the bottom doped diode region(s) 222 are simultaneously formed.

The bottom S/D region(s) 220 form a respective bottom or lower portion to the associated S/D region 164. Together, the S/D region 164 and the bottom S/D region 220 form either the source or the drain to applicable transistor within the transistor region 111. The bottom S/D region 220 is connected to at least the bottom surface of the S/D region 164 there above. The bottom S/D region 220 may be composed of the same semiconductor material and the same dopant relative to the associated S/D region 164. For example, the bottom S/D region 220 may be composed of the same semiconductor material and the same dopant relative to the associated S/D region 164. In examples, the dopant concentration within the bottom S/D region 220 may be relatively higher compared to the associated S/D region 164. For example, the bottom S/D region 220 may be heavily doped. In examples, the dopant concentration within the bottom S/D region 220 may be relatively higher compared to the associated S/D region 164 which may benefit transistor 100.2 performance. For example, the bottom S/D region 220 may be heavily doped. In examples wherein transistor 100.2 is a pFET and the S/D region 164 and the bottom S/D region 220 are composed of SiGe, the relative percentage of Ge within the bottom S/D region 220 may be higher compared to the associated S/D region 164 which may benefit transistor 100.2 performance.

The bottom S/D region 220 may be upon the bottom surface of the associated S/D region 164, between neighboring bottom isolation 142, within the bottom ILD 204 and/or ILD 176, and between neighboring STI regions 130. The bottom surface of the bottom S/D region 220 may be between the top surface of the STI regions 130 and the bottom STI regions 130.

Bottom doped diode region(s) 222 is upon the upper substrate 102 within the diode region 113 and forms the bottom doped region for one or more of the vertical diodes 100.6, 100.8, 100.10, etc. therein. The bottom doped diode region(s) 222 are connected to at least the bottom surface of the associated upper substrate 102 strip there above. The bottom doped diode region(s) 222 may be composed of the same semiconductor material and the same dopant with a substantially same dopant concentration relative to the bottom S/D region 220. For example, when transistor 100.2 is a pFET and the S/D region 164 and the bottom S/D region 220 are composed of SiGe, the relative percentage of Ge within the bottom S/D region(s) 220 and within the S/D region(s) 164 may be substantially the same. The bottom doped diode region(s) 222 may be composed of a dopant that results in the opposite doped region relative to the associated top doped diode region(s) 164' that are connected to the same upper substrate 102 strip. For example, when bottom doped diode region(s) 222 are p-doped the associated top doped diode region(s) 164' may be n-doped.

The dopant that is present in the bottom S/D region(s) 220 and the bottom doped diode region(s) 222 can be a p-type dopant and may resultantly form respective p-doped S/D region(s) 220 and bottom doped diode region(s) 222. Alternatively, the dopant that is present in the bottom S/D region(s) 220 and the bottom doped diode region(s) 222 can be a n-type dopant and may resultantly form respective n-doped S/D region(s) 220 and bottom doped diode region(s) 222.

The bottom S/D region(s) 220 and the bottom doped diode region(s) 222 may be simultaneously epitaxially grown or formed and may, therefore, include one or more diamond surfaces 225 (e.g., the lower S/D regions 164 and the bottom doped diode regions 222 may respectively have one or more (111) orientated diamond like crystallographic surfaces, as depicted). In some examples, the bottom S/D region(s) 220 and the bottom doped diode region(s) 222 are formed by in-situ doped epitaxial growth. The use of an in-situ doping process is merely an example. For instance, one may instead employ an ex-situ process to introduce dopants into the bottom S/D region(s) 220 and the bottom doped diode region(s) 222. Other doping techniques can be used to incorporate dopants in the bottom S/D region(s) 220 and the bottom doped diode region(s) 222.

In some examples, the epitaxial growth that resultantly forms the bottom S/D region(s) 220 occurs or is promoted from the bottom surface of the associated S/D region 164, while epitaxial growth is limited or does not occur from neighboring STI regions 130, bottom isolation 142, ILD 176, backside ILD 204, or the like. Similarity, this epitaxial growth that resultantly forms the bottom doped diode region(s) 222 occurs or is promoted from the bottom surface of the upper substrate 102, while epitaxial growth is limited or does not occur from neighboring STI regions 130, or the like.

Figure 11:
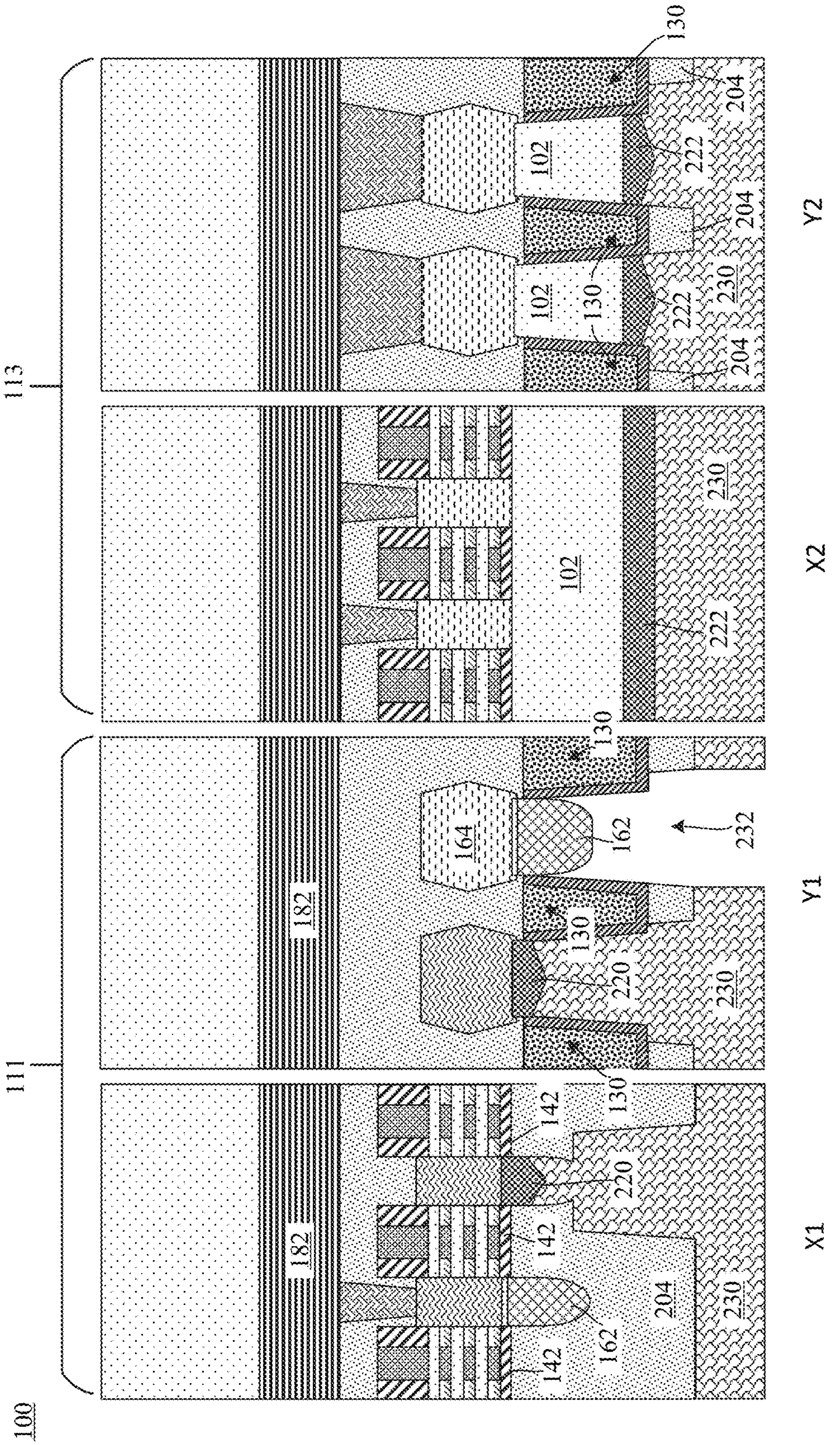

FIG. 11 depicts cross-sectional views of semiconductor IC device 100 shown after illustrative fabrication operation(s), in accordance with one or more embodiments. In the depicted fabrication stage, backside contact openings 232 may be formed. The backside contact openings 232 may be formed by the same or shared lithography and etch process(es), or sequential lithography and etch processes. In such process(es), a mask 230 may be applied to the backside of the semiconductor IC device 100 and patterned. Openings in the patterned mask may sequentially expose the portion(s) of the underlying STI region(s) 130, expose the backside ILD 204, and expose the underlying backside contact placeholder 162 that are to be removed while other protected portions of semiconductor IC device 100 may be protected and retained.

The backside contact opening 232 may be formed to expose the associated backside contact placeholder 162 there above (e.g., the backside contact placeholder 162 that is below a S/D region 164 that is not connected to the frontside BEOL network 182).

Figure 12:
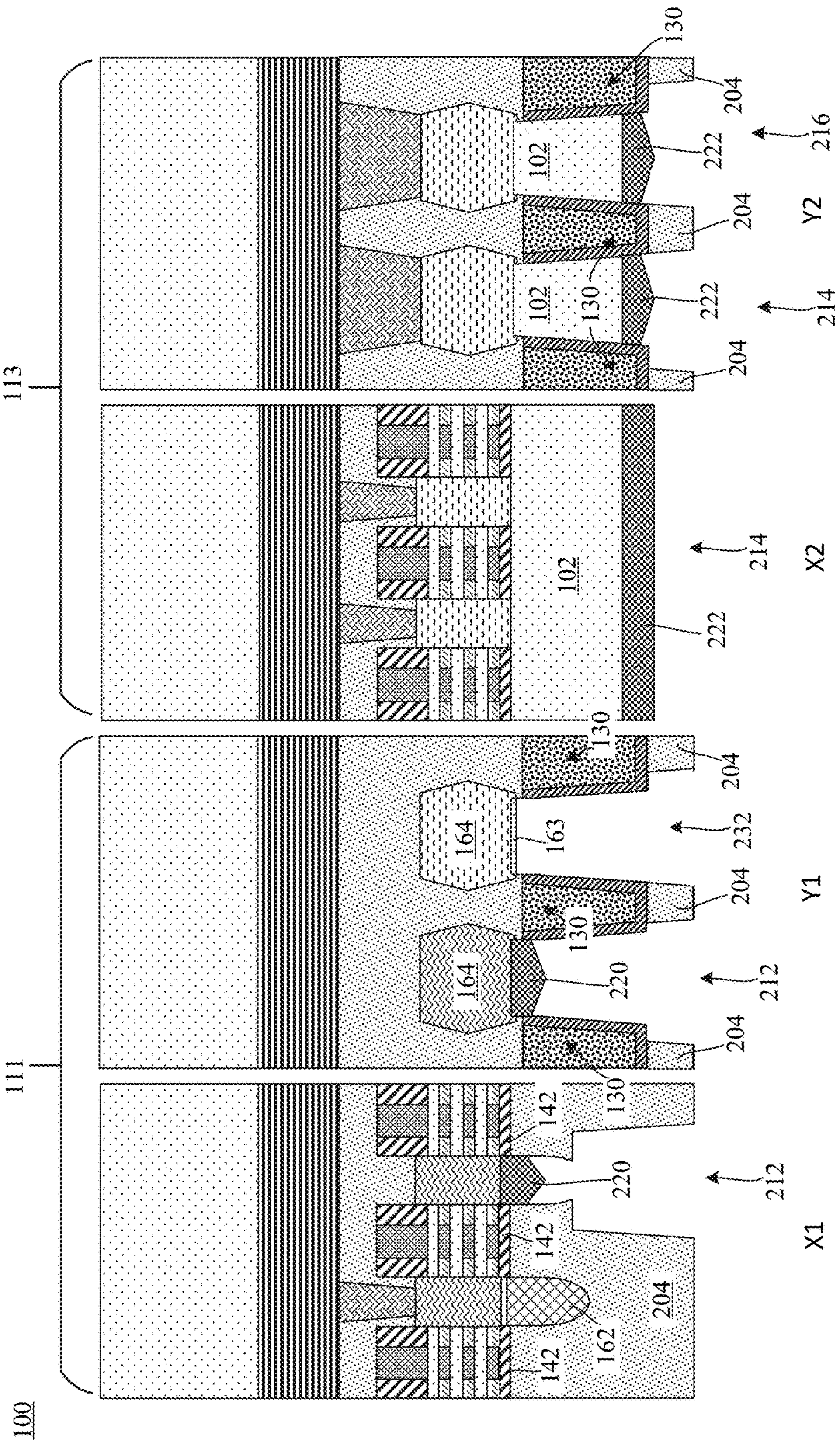

FIG. 12 depicts cross-sectional views of semiconductor IC device 100 shown after illustrative fabrication operation(s), in accordance with one or more embodiments. In the depicted fabrication stage, the backside contact placeholder(s) 162 that are exposed by a respective backside contact opening 232 may be removed by a substrative removal technique, such as an etch. In one example, the backside contact placeholder 162 is removed using the separation layer 163 as an etch stop to protect the S/D region 164 there above.

For clarity, the backside contact placeholder(s) 162 that are exposed by respective backside contact opening(s) and removed at the present fabrication stage may further be those backside contact placeholder(s) 162 that are underneath S/D region 164 that are analogously doped relative to at least the first group of top doped diode regions 164' within diode region 113. For example, if the first group of top doped diode regions 164' within diode region 113 are n-doped regions, then those backside contact placeholder(s) 162 that are underneath n-doped S/D regions 164 and that are not connected to the frontside BEOL network 182 may be removed at the present fabrication stage, as depicted.

Subsequently, the mask 230 may be removed by an etch, OPL ash, or the like, and the backside contact openings 212, 214, 216, and 232 may resultantly be reopened. Removal of the mask 230 may further expose respective portions of the backside ILD 204, the STI region(s) 130, the bottom S/D region(s) 220, separation layer(s) 163, bottom doped diode region(s) 222, or the like.

FIG. 13 depicts cross-sectional views of semiconductor IC device 100 shown after illustrative fabrication operation(s), in accordance with one or more embodiments. In the depicted fabrication stage, backside contacts 240, 242, 244, and 246 may be formed within a respective backside contact opening. Further in the depicted fabrication stage, a planarization process, such as a CMP process or a mechanical grinding process, may remove excess portions of the backside contact(s) 240, 242, 244, and 246 may remove excess portions of STI region(s) 130, may remove excess portions of backside ILD 204, and the like. Further in the depicted fabrication stage, a backside BEOL network 250 may be formed.

Respective backside contacts 240, 242, 244, and 246 may be formed within a respective backside contact opening (e.g., backside contact openings 212, 214, 216, 232, or the like) by depositing conductive material, such as metal, into the respective backside contact openings. In an example, backside contacts 240, 242, 244, and 246 may be simultaneously formed by depositing a liner, such as Ni, NiPt or Ti, etc. onto the backside of semiconductor IC device 100 and into the backside contact openings, depositing an adhesion liner, such as TiN, TaN, etc. upon the liner, and by depositing a conductive fill, such as Al, Ru, W, Co, Cu, etc. upon the adhesion liner.

Subsequently, a planarization process, such as a CMP, may expose a bottom surface of the backside ILD 204. As a result, the respective bottom surfaces of backside contacts 240, 242, 244, and 246 and backside ILD 204 may be substantially horizontal and/or substantially coplanar.

The backside BEOL network 250, such as a backside power distribution network (BSPDN) may be formed upon the backside contacts 240, 242, 244, and 246 and upon the backside ILD. The backside BEOL network 250 may include signal wires for signal routing and power wires for providing power potential (e.g., VDD, VSS, etc.). The backside BEOL network 250 may allow for the distribution of power wires and signal wires between both the frontside and backside of the semiconductor IC device. The backside BEOL network 250 may further allow for the full or partial decoupling of signal routing and/or power routing and/or allows for dividing or splitting power wires and/or signal wires between both the frontside and backside of the semiconductor IC device. By incorporating the backside BEOL network 250, routing congestion may be reduced, which may lead to further semiconductor IC device 100 scaling. For example, semiconductor IC devices that incorporate a backside BEOL network can result in a 30% area reduction and improved current-resistance (IR) drop compared to typical semiconductor IC devices that include solely a frontside BEOL network.

The backside BEOL network 250 may be indirectly electrically and/or indirectly physically connected to the one or more S/D regions 164 or bottom doped diode region(s) 222 by way of a particular backside contact. For example, a first backside wire within the backside BEOL network 250 may be electrically connected the backside contact 240, a second backside wire within the backside BEOL network 250 may be electrically connected to backside contact 240, a third backside wire within the backside BEOL network 250 may be electrically connected to backside contact 244, a fourth backside wire within the backside BEOL network 250 may be electrically connected to backside contact 246.

The backside BEOL network 250 can include one or more interconnect dielectric material layers and contains backside conductive wires and/or interconnects, such as VIAs, embedded therein. In some embodiments, the backside wires within the backside BEOL network 250 are composed of Cu. The backside BEOL network 250 can include "x" numbers of backside metal levels, wherein "x" is an integer starting from 1. If not included in frontside BEOL network 182, backside BEOL network 250 may further contain conductive pads that are connected to one or more of the backside metal wires and may be used to connect the semiconductor IC device 100 to the external and/or higher-level structure.

In an example, signal routing and power routing is effectively split between the frontside BEOL network 182 and the backside BEOL network 250. For example, at least 90% of the frontside metal wires (e.g., furthest from the transistors 100.2, 100.4, 100.6, 100.8, and 100.10) are signal routing metal wires and the remainder frontside metal wires which are usually present in metal levels closest to the transistors, can be used as power routing wires. Further in this example, at least 90% of the backside metal wires that are in metal levels closest to the backside contacts are power routing metal wires and the remainder backside metal wires which are usually present in metal levels furthest away from the backside contacts, can be used as signal routing wires. Power routing wires may be less dense than signal routing wires. A signal routing wire is defined herein as a conductive feature, such as a wire, interconnect, or the like, that is configured to electrically carry a functional or logical potential or signal that is to change or is otherwise dynamic over time. A power routing wire is defined herein as a conductive feature, such as a wire, trace, plane, or the like, that is configured to electrically carry power potential. For example, a power routing wire carries or otherwise has a functional power potential, such as VDD, VSS, or the like. For clarity, in some examples, the backside BEOL network 250 may be a backside power distribution network (BSPDN).

The backside BEOL network 250 includes various wiring levels. The wiring levels may alternate between a VIA level and a metal level. To form a VIA level, an associated dielectric passivation layer may be formed, the dielectric passivation layer may be patterned to create a VIA opening therein, and conductive or metal material may be deposited within the VIA opening to form a via contact.

To form a metal level, an associated dielectric layer may be formed, the dielectric layer may be patterned to create a wiring trench therein, and conductive or metal material may be deposited within the wiring trench to form a wire and/or a VIA. A wire, such as within a lowest metal level may connect directly to the backside contact(s).

Semiconductor IC device 100 may be an integrated circuit (IC) chip. IC chips can be distributed by the fabricator in raw wafer form (that is, as a single wafer that has multiple unpackaged chips), as a bare die, or in a packaged form. In the latter case, the IC chip may mount in a single chip package (such as a plastic carrier, with leads that are affixed to a motherboard or other higher-level carrier) or in a multichip package (such as a ceramic carrier that has either or both surface interconnections or buried interconnections). In any case, the IC chip may be integrated with other chips, discrete circuit elements, and/or other signal processing devices as part of either (a) an intermediate product, such as a motherboard, or (b) an end product. The end product can be any product that includes the IC chip, ranging from toys and other low-end applications to advanced computer products having a display, a keyboard or other input device, and a central processor.

Figure 14:
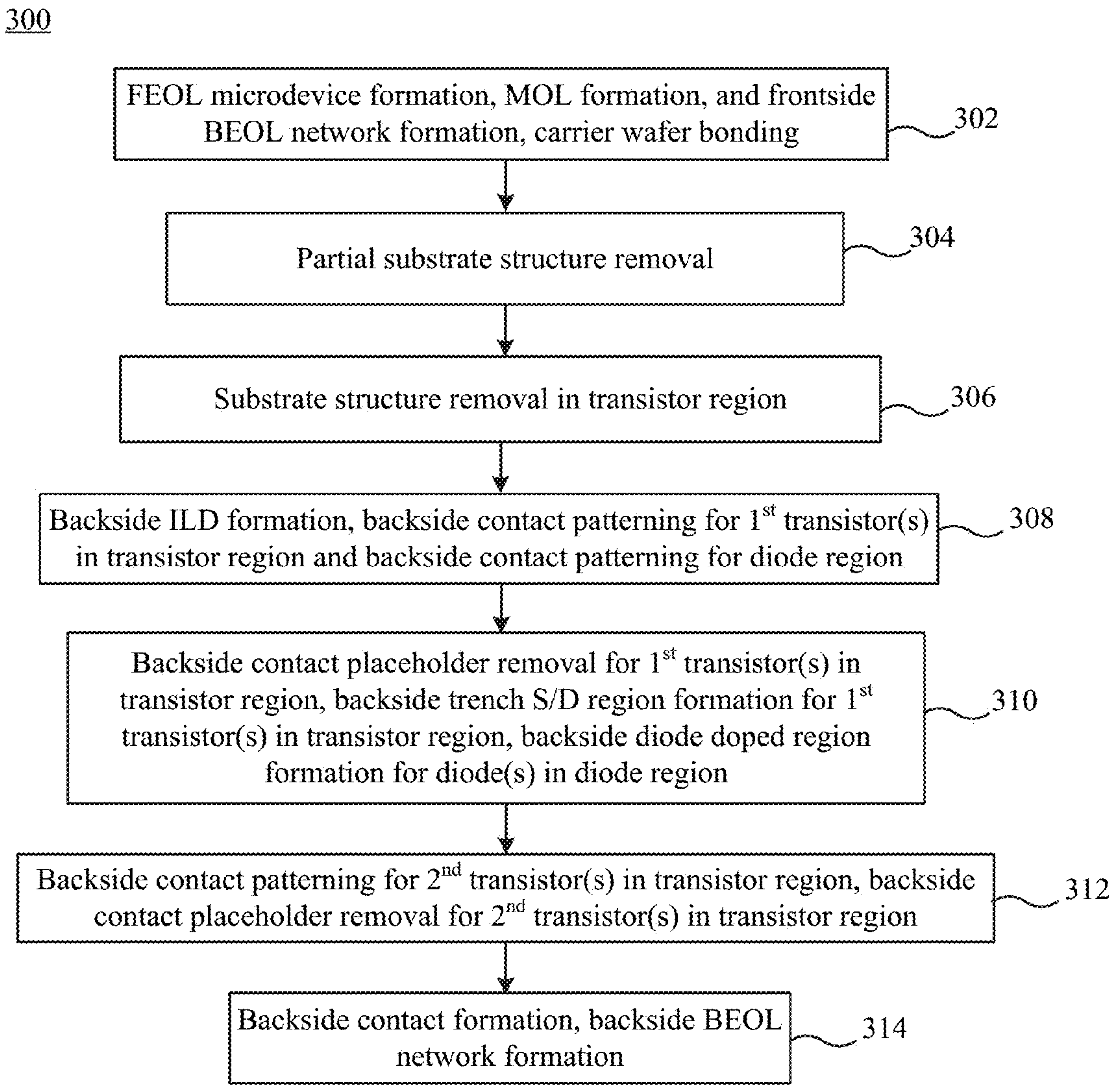
FIG. 14 depicts a method of fabricating a semiconductor IC device that includes a transistor and a vertical diode, according to one or more embodiments of the disclosure.

FIG. 14 depicts a flow diagram illustrating a method 300 to fabricate a semiconductor IC device, such as semiconductor IC device 100. The depicted fabrication operations of method 300 are illustratively depicted and described above with reference to one or more of FIG. 3 through FIG. 13 of the drawings, which describe the fabrication of semiconductor IC device 100, though the fabrication operations described in method 300 may be used to fabricate other types of semiconductor IC devices. The method 300 depicted herein is illustrative. There can be many variations to the diagram or operations described therein without departing from the spirit of the embodiments. For instance, the operations can be performed in a differing order, or operations can be added, deleted, or modified.

At block 302, method 300 may begin with forming one or more front end of line (FEOL) microdevices, such as transistors and such portions of vertical diodes, with forming middle of line (MOL) structures, such as frontside contact(s), with forming a frontside back end of line (BEOL) network, and with attaching a carrier wafer thereto. For example, one or more transistors, such as transistors 100.2, 100.4, are formed, top doped diode regions 164' of one or more vertical diodes, such as vertical diodes 100.6, 100.8, 100.10, and 100.12, are formed, one or more frontside contacts 180 are formed that may contact components or regions (such as S/D regions 164 and top doped diode regions 164), the frontside BEOL network 182 is formed upon the one or more frontside contacts, and a carrier wafer 184 is bonded to the frontside BEOL network 182.

At block 304, the semiconductor IC device may be flipped, and a substrate associated with the FEOL microdevices may be partially removed. For example, the lower substrate 101 of the substrate structure may be removed, the etch stop layer 103 of the substrate structure may be removed, and the upper substrate 102 of the substrate structure may be partially removed.

At block 306, method 300 may continue with masking the diode region, removing the substrate structure in the transistor region, and removing the mask. For example, mask 200 is formed upon the diode region 113, the upper substrate 102 is removed from the transistor region 113, and mask 200 is removed.

At block 308, method 300 may continue with forming a backside ILD and forming backside contact openings within the backside ILD for a first group of transistors within the transistor region and with forming backside contact openings within the diode region. For example, the backside ILD 204 may be deposited over the backside placeholders 162, over STI region(s) 130, and over the upper substrate 102, or the like. Then, backside contact openings, such as backside contact openings 212, may be formed within the backside ILD 204 to expose associated backside contact placeholders 162 associated with the first group of transistors within the transistor region 111 that have S/D regions 164 of the opposite doping relative to the doping of at least a first group (or all of) the top doped diode regions 164' within the diode region 113. Next, or simultaneously, backside contact openings, such as backside contact openings 214, 216, may be formed within the backside ILD 204 to expose the upper substrate 102 strips that are below the top doped diode regions 164' within the diode region 113. For example, if the top doped diode regions 164' are n-doped, the backside contact openings 212 are formed under p-doped S/D regions 164 withing the transistor region 111 and backside contact openings 214, 216 are formed under the top doped diode regions 164' and expose the upper substrate 102 strips there below.

At block 310, method 300 may continue with removing the exposed backside contact placeholders associated with the first group of transistors, with forming backside doped S/D regions in place of the removed backside contact placeholders, and with forming backside doped diode regions against the upper substrate 102 strips. For example, the backside contact placeholders 162 (and associated separation layer 163 associated therewith if present) may be removed and bottom S/D region(s) 220 may be epitaxially grown from the exposed S/D regions 164 of the first group of transistors within the transistor region 111. Simultaneous to forming the bottom S/D region(s) 220, the bottom doped diode region(s) 222 may be epitaxially grown from the upper substrate 102 strips within the diode region 113.

At block 312, method 300 may continue with forming backside contact openings for a second group of transistors in the transistor region and with removing the backside contact placeholders that are exposed by the backside contact openings for the second group of transistors. For example, backside contact openings, such as backside contact openings 232, may be formed within the backside ILD 204 to expose associated backside contact placeholders 162 associated with the second group of transistors within the transistor region 111 that have S/D regions 164 of analogous doping relative to the doping of at least the first group (or all of) the top doped diode regions 164' within the diode region 113. Next, the backside contact placeholders 162 that are exposed by the backside contact openings, such as backside contact openings 232, may be removed.

At block 314, method 300 may further continue with forming a backside contact within a respective backside contact opening and with forming a backside BEOL network over the backside contacts. For example, a backside contact 240 may be formed within backside contact opening 212, a backside contact 242 may be formed within backside contact opening 232, a backside contact 244 may be formed within backside contact opening 214, and backside contact 246 may be formed within backside contact opening 216. Subsequently, a CMP process may remove excess backside contact material and a backside BEOL network 250 may be formed upon the planarized backside of semiconductor IC device 100.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor integrated circuit (IC) device comprising:

a transistor comprising a first p-doped source/drain (S/D) region, a second p-doped S/D region, one or more channels between the first p-doped S/D region and the second p-doped S/D region, a gate around the one or more channels, and a p-doped trench S/D region below and connected to the first p-doped S/D region; and a vertical diode comprising an intrinsic semiconductor region between a top n-doped diode region and a bottom p-doped diode region.

2. The semiconductor IC device of claim 1, wherein the p-doped trench S/D region and the bottom p-doped diode region are both composed of a semiconductor material and a dopant.

3. The semiconductor IC device of claim 2, wherein a concentration of the dopant within the p-doped trench S/D region is substantially the same as a concentration of the dopant within the bottom p-doped diode region.

4. The semiconductor IC device of claim 1, wherein a top surface of the bottom p-doped diode region is below a bottom surface of the p-doped trench S/D region.

5. The semiconductor IC device of claim 1, wherein a bottom surface of the p-doped S/D region, a bottom surface of the second p-doped S/D region, and a bottom surface of the n-doped diode region are substantially coplanar.

6. The semiconductor IC device of claim 5, wherein a top surface of the first p-doped S/D region, a top surface of the second p-doped S/D region, and a top surface of the n-doped diode region are substantially coplanar.

7. The semiconductor IC device of claim 1, further comprising:

an inactive region adjacent to the vertical diode, the inactive region comprising one or more inactive channels connected to the n-doped diode region and an inactive gate around the one or more inactive channels.

8. The semiconductor IC device of claim 7, wherein the one or more inactive channels are inactive because charge carriers do not flow through the one or more inactive channels.

9. The semiconductor IC device of claim 7, wherein the inactive gate is electrically isolated.

10. The semiconductor IC device of claim 1, wherein a dopant concentration within the first p-doped S/D region is less than a dopant concentration within the p-doped trench S/D region.

11. The semiconductor IC device of claim 1, wherein a bottom surface of the p-doped trench S/D region is below a bottom surface of the p-doped S/D region.

12. The semiconductor IC device of claim 1, further comprising:

a backside S/D contact connected to the p-doped trench S/D region;

a backside diode contact connected to the bottom p-doped diode region; and a backside back end of line (BEOL) network comprising a first backside wire connected to the backside S/D contact and a second backside wire connected to the backside diode contact.

13. The semiconductor IC device of claim 12, further comprising:

a frontside S/D contact connected to the second S/D region;

a frontside diode contact connected to the top n-doped diode region; and a frontside BEOL network comprising a first frontside wire electrically connected to the frontside S/D contact and a second frontside wire connected to the frontside diode contact.

14. A semiconductor integrated circuit (IC) device comprising:

a transistor region comprising a transistor, the transistor comprising a first p-doped source/drain (S/D) region, a second p-doped S/D region, one or more channels between the first p-doped S/D region and the second p-doped S/D region, and a gate around the one or more channels, and a p-doped trench S/D region below the first p-doped S/D region; and a diode region comprising a first vertical diode that includes a first top n-doped diode region, a second vertical diode that includes a second top n-doped diode region, a shared intrinsic semiconductor region connected to the first top n-doped diode region and to the second top n-doped diode region, and a shared bottom p-doped diode region connected to the shared intrinsic semiconductor region.

15. The semiconductor IC device of claim 14, wherein the p-doped trench S/D region and the shared bottom p-doped diode region are both composed of a same semiconductor material and a same dopant at a substantially same concentration.

16. The semiconductor IC device of claim 14, wherein a top surface of the shared bottom p-doped diode region is below a bottom surface of the p-doped trench S/D region.

17. The semiconductor IC device of claim 14, wherein a bottom surface of the first p-doped S/D region, a bottom surface of the second p-doped S/D region, a bottom surface of the first n-doped diode region, and a bottom surface of the second n-doped diode region are substantially coplanar.

18. The semiconductor IC device of claim 14, wherein the diode region further comprises:

an inactive region between to the first vertical diode and the second vertical diode, the inactive region comprising:

one or more inactive channels between the first n-doped diode region and the second n-doped diode region; and an inactive gate around the one or more inactive channels.

19. The semiconductor IC device of claim 14, wherein a dopant concentration within the first p-doped S/D region and within the second p-doped S/D region is less than a dopant concentration within the first p-doped trench S/D region.

* * * * *